US012749526B2

(12) United States Patent
Ahn

(10) Patent No.: US 12,749,526 B2
(45) Date of Patent: Sep. 29, 2026

(54) SEMICONDUCTOR MEMORY DEVICE AND CONTROLLER FOR READING DATA WITH IMPROVED SPEED, AND METHOD OF OPERATING THE SEMICONDUCTOR MEMORY DEVICE AND THE CONTROLLER

(71) Applicant: SK hynix Inc., Icheon-si (KR)

(72) Inventor: Sung Ho Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 19/308,716

(22) Filed: Aug. 25, 2025

(65) Prior Publication Data

US 2025/0391465 A1 Dec. 25, 2025

Related U.S. Application Data

(62) Division of application No. 17/962,694, filed on Oct. 10, 2022, now Pat. No. 12,417,800.

(30) Foreign Application Priority Data

May 24, 2022 (KR) ........................ 10-2022-0063740

(51) Int. Cl.
*G11C 11/4096* (2006.01)
*G11C 11/408* (2006.01)
*G11C 11/4093* (2006.01)

(52) U.S. Cl.
CPC ...... *G11C 11/4096* (2013.01); *G11C 11/4085* (2013.01); *G11C 11/4093* (2013.01)

(58) Field of Classification Search
CPC ............ G11C 11/4096; G11C 11/4085; G11C 11/4093; G11C 29/52; G11C 16/08; G11C 16/32; G11C 11/5642; G11C 16/0483; G11C 16/26; G11C 16/14; G11C 16/3404; G11C 7/1048; G06F 3/0658; G06F 3/0659; G06F 3/0679; G06F 11/1048
See application file for complete search history.

(56) References Cited

U.S. PATENT DOCUMENTS 9,785,382 B2 * 10/2017 Xie ..................... G06F 12/0646
11,024,393 B1 6/2021 Zhang et al.
2006/0291292 A1 12/2006 Kwon et al.
(Continued)

FOREIGN PATENT DOCUMENTS

CN 110322919 A 10/2019
JP 2018501598 A 1/2018
(Continued)

*Primary Examiner* — Jerome Leboeuf
*Assistant Examiner* — Christopher Lane Reece
(74) *Attorney, Agent, or Firm* — WILLIAM PARK AND ASSOCIATES LTD.

(57) ABSTRACT

A semiconductor memory device includes a memory cell array, a peripheral circuit, and a control logic. The memory cell array includes a plurality of memory cells. The peripheral circuit performs a read operation on selected memory cells, among the plurality of memory cells. The control logic controls the read operation of the peripheral circuit in response to a read command that is received from an external device and determines whether to perform a discharge operation of word lines that are connected to the plurality of memory cells based on a type of the read command.

8 Claims, 25 Drawing Sheets

(56) References Cited

U.S. PATENT DOCUMENTS

| | | | | |
|---|---|---|---|---|
| 2014/0226402 | A1 | 8/2014 | Duzly et al. | |
| 2016/0188210 | A1 | 6/2016 | Tanzawa | |
| 2018/0190354 | A1 | 7/2018 | Lee | |
| 2019/0080772 | A1 | 3/2019 | Yanagidaira | |
| 2019/0304555 | A1* | 10/2019 | Lee | G11C 16/10 |
| 2020/0411100 | A1* | 12/2020 | Kamae | G06F 3/064 |
| 2022/0383961 | A1 | 12/2022 | Lien et al. | |

FOREIGN PATENT DOCUMENTS

| | | | |
|---|---|---|---|
| JP | 2019053797 | A | 4/2019 |
| KR | 1020060135099 | A | 12/2006 |
| KR | 1020070107414 | A | 11/2007 |
| KR | 1020170092006 | | 8/2017 |

* cited by examiner

SEMICONDUCTOR MEMORY DEVICE AND CONTROLLER FOR READING DATA WITH IMPROVED SPEED, AND METHOD OF OPERATING THE SEMICONDUCTOR MEMORY DEVICE AND THE CONTROLLER

CROSS-REFERENCE TO RELATED APPLICATION

The present application is a divisional application of U.S. patent application Ser. No. 17/962,694, filed on Oct. 10, 2022, which claims priority under 35 U.S.C. § 119(a) to Korean patent application number 10-2022-0063740 filed on May 24, 2022, in the Korean Intellectual Property Office, the entire contents of which applications are incorporated herein by reference.

BACKGROUND

1. Technical Field

The present disclosure relates to an electronic device, and more particularly, to a semiconductor memory device and a controller for reading data with improved speed, and a method of operating the semiconductor memory device and the controller.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed in order to resolve a limit of an integration degree of a two-dimensional semiconductor memory device, and may include a plurality of memory cells that are vertically stacked on a semiconductor substrate.

A controller may control an operation of the semiconductor memory device. Specifically, in response to a request received from a host, the controller controls the semiconductor memory device to perform an operation corresponding to the request by transmitting a command to the semiconductor memory device. Alternatively, regardless of the request from the host, the controller may control the semiconductor memory device to perform an internal operation such as garbage collection.

SUMMARY

According to an embodiment of the present disclosure, a semiconductor memory device includes a memory cell array, a peripheral circuit, and a control logic. The memory cell array includes a plurality of memory cells. The peripheral circuit performs a read operation on selected memory cells among the plurality of memory cells. The control logic controls the read operation of the peripheral circuit in response to a read command that is received from an external device and determines whether to perform a discharge operation of word lines that are connected to the plurality of memory cells based on a type of the read command.

According to another embodiment of the present disclosure, by a method of operating a semiconductor memory device including a plurality of memory cells, a read command is received from an external device, data is read from selected memory cells among the plurality of memory cells in response to the read command, and whether to perform a discharge operation on word lines that are connected to the plurality of memory cells is determined based on a type of the read command.

According to still another embodiment of the present disclosure, by a method of operating a controller, a read operation of a semiconductor memory device including a plurality of memory cells is controlled. By the method of operating the controller, one of a first type of read command and a second type of read command is transmitted to the semiconductor memory device, data is received from the semiconductor memory device, and whether to transmit a discharge command to the semiconductor memory device is determined based on a type of the read command that is transmitted to the semiconductor memory device. The first type of read command controls the semiconductor memory device to perform a read operation including a word line discharge operation, and the second type of read command controls the semiconductor memory device to perform a read operation without the word line discharge operation.

According to still another embodiment of the present disclosure, by a method of operating a controller, a read operation of a semiconductor memory device including a plurality of memory cells is controlled. By the method of operating the controller, a first type of read command is transmitted to the semiconductor memory device, first data is received from the semiconductor memory device, and whether to transmit a second type of read command is determined to the semiconductor memory device based on whether an error correction operation on the first data is successful. The first type of read command controls the semiconductor memory device to perform a read operation including a word line discharge operation, and the second type of read command controls the semiconductor memory device to perform a read operation without the word line discharge operation.

DETAILED DESCRIPTION

Specific structural or functional descriptions of embodiments according to the concept which are disclosed in the present specification or application are illustrated only to describe the embodiments according to the concept of the present disclosure, and the embodiments according to the concept of the present disclosure may be implemented in various forms and should not be construed as being limited to the embodiments described in the present specification or application.

An embodiment of the present disclosure provides a semiconductor memory, a controller, and a method of operating the semiconductor memory and the controller capable of increasing a read speed when a read operation is repeated.

The present technology may provide a semiconductor memory, a controller, and a method of operating the semiconductor memory and the controller capable of increasing a read speed when a read operation is repeated.

Figure 1:
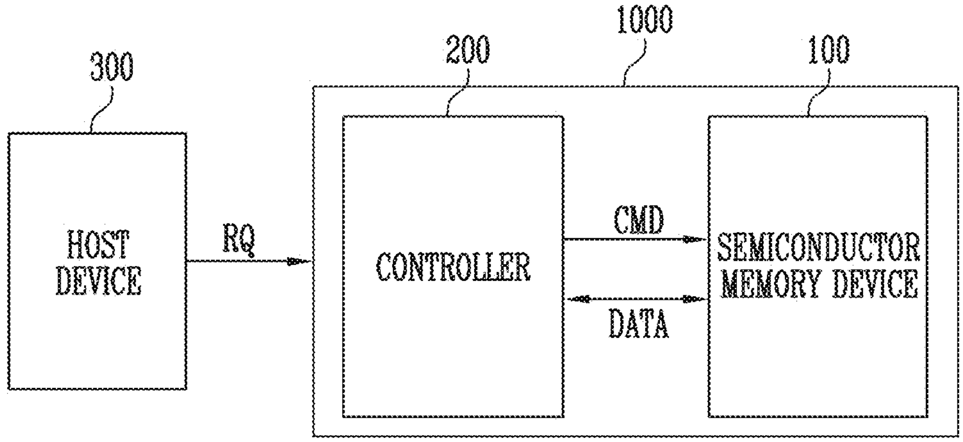
FIG. 1 is a block diagram illustrating a memory system and a host device.

FIG. 1 is a block diagram illustrating a memory system and a host device.

Referring to FIG. 1, the memory system 1000 may include a semiconductor memory device 100 and a controller 200. In addition, the memory system 1000 may communicate with the host device 300. The controller 200 may control an overall operation of the semiconductor memory device 100. In addition, the controller 200 may control the operation of the semiconductor memory device 100 based on an operation request RQ that is received from the host device 300.

The semiconductor memory device 100 may operate in response to control of the controller 200. The semiconductor memory device 100 may include a memory cell array having a plurality of memory blocks. In an embodiment, the semiconductor memory device 100 may be a flash memory device.

The controller 200 may exchange user data based on the request RQ from the host device 300. Specifically, the controller 200 may receive a write request, a read request, a trim request, or the like of the host device 300 and may control the semiconductor memory device 100 based on the received requests. More specifically, the controller 200 may generate commands CMD for controlling an operation of the semiconductor memory device 100 and may transmit the commands CMD to the semiconductor memory device 100. Meanwhile, the controller 200 may exchange data DATA with the semiconductor memory device 100.

In an embodiment, the controller 200 may control the operation of the semiconductor memory device 100 regardless of the request from the host device 300. For example, the controller 200 may control the operation of the semiconductor memory device 100 so that the memory system 1000 internally performs a garbage collection operation.

The semiconductor memory device 100 may be configured to receive a command and an address from the controller 200 and may access an area that is selected by the address in the memory cell array. That is, the semiconductor memory device 100 may perform an internal operation corresponding to the command with respect to the area that is selected by the address.

For example, the semiconductor memory device 100 may perform a program operation, a read operation, and an erase operation. During the program operation, the semiconductor memory device 100 may program data in the area that is selected by the address. During the read operation, the semiconductor memory device 100 may read data from the area that is selected by the address. During the erase operation, the semiconductor memory device 100 may erase data that is stored in the area that is selected by the address.

Figure 2:
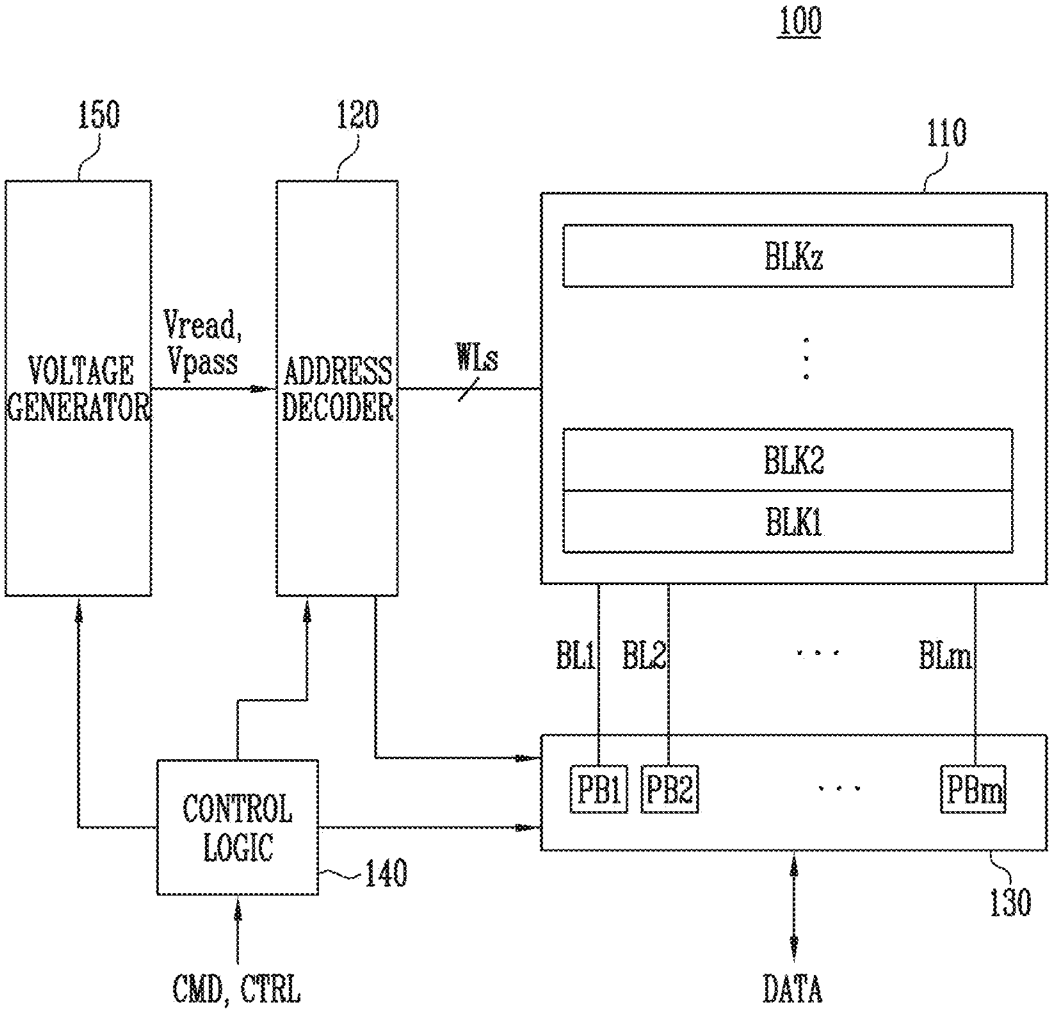
FIG. 2 is a block diagram illustrating a semiconductor memory device according to an embodiment of the present disclosure.

FIG. 2 is a block diagram illustrating a semiconductor memory device according to an embodiment of the present disclosure.

Referring to FIG. 2, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz may be connected to the address decoder 120 through word lines WLs. The plurality of memory blocks BLK1 to BLKz may be connected to the read and write circuit 130 through bit lines BL1 to BLm. Each of the plurality of memory blocks BLK1 to BLKz may include a plurality of memory cells. In an embodiment, the plurality of memory cells may be non-volatile memory cells and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells that is included in the memory cell array may store at least one bit of data. In an embodiment, each of the plurality of memory cells that is included in the memory cell array 110 may be a single-level cell (SLC) that stores one bit of data. In another embodiment, each of the plurality of memory cells that is included in the memory cell array 110 may be a multi-level cell (MLC) that stores two bits of data. In still another embodiment, each of the plurality of memory cells that is included in the memory cell array 110 may be a triple-level cell that stores three bits of data. In still another embodiment, each of the plurality of memory cells that is included in the memory cell array 110 may be a quad-level cell that stores four bits of data. According to an embodiment, the memory cell array 110 may include a plurality of memory cells, each storing five or more bits of data.

The address decoder 120, the read and write circuit 130, and the voltage generator 150 may operate as a peripheral circuit that drives the memory cell array 110. The peripheral circuit may perform a read operation, a write operation, and an erase operation on the memory cell array 110 based on the control of the control logic 140. The address decoder 120 may be connected to the memory cell array 110 through the word lines WLs. The address decoder 120 may be configured to operate in response to control of the control logic 140. The address decoder 120 may receive an address through an input/output buffer (not shown) inside the semiconductor memory device 100.

The address decoder 120 may be configured to decode a block address, among received addresses. The address decoder 120 may select at least one memory block according to the decoded block address. In addition, the address decoder 120 may apply a read voltage Vread that is generated by the voltage generator 150 to a selected word line, among the selected memory block, at a read voltage application operation during a read operation and may apply a pass voltage Vpass to the remaining unselected word lines. In addition, the address decoder 120 may apply a verify voltage that is generated by the voltage generator 150 to the selected word line, among the selected memory block, and may apply the pass voltage Vpass to the remaining unselected word lines during a program verify operation.

The address decoder 120 may be configured to decode a column address of the received addresses. The address decoder 120 may transmit the decoded column address to the read and write circuit 130.

The read operation and a program operation of the semiconductor memory device 100 may be performed in a page unit. Addresses that are received at time of a request of the read operation and the program operation may include a block address, a row address, and a column address. The address decoder 120 may select one memory block and one word line according to the block address and the row address. The column address may be decoded by the address decoder 120 and may be provided to the read and write circuit 130.

The address decoder 120 may include a block decoder, a row decoder, a column decoder, an address buffer, and the like.

The read and write circuit 130 may include a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change in current that flows according to a program state of a corresponding memory cell through a sensing node while continuously supplying a sensing current to the bit lines that are connected to the memory cells and may latch the sensed change as sensing data. The read and write circuit 130 may operate in response to page buffer control signals that are output from the control logic 140.

During the read operation, the read and write circuit 130 may sense data of the memory cell, temporarily store the read data, and output data DATA to the input/output buffer (not shown) of the semiconductor memory device 100. In an exemplary embodiment, the read and write circuit 130 may include a column selection circuit, and the like, in addition to the page buffers (or page registers).

The control logic 140 may be connected to the address decoder 120, the read and write circuit 130, and the voltage generator 150. The control logic 140 may receive a command CMD and a control signal CTRL through the input/output buffer (not shown) of the semiconductor memory device 100. The control logic 140 may be configured to control overall operations of the semiconductor memory device 100 in response to the control signal CTRL. In addition, the control logic 140 may output a control signal for adjusting a sensing node pre-charge potential level of the plurality of page buffers PB1 to PBm. The control logic 140 may control the read and write circuit 130 to perform the read operation of the memory cell array 110.

The voltage generator 150 may generate the read voltage Vread and the pass voltage Vpass during the read operation in response to the control signal that is output from the control logic 140. In order to generate a plurality of voltages having various voltage levels, the voltage generator 150 may include a plurality of pumping capacitors that receive an internal power voltage and may generate the plurality of voltages by selectively activating the plurality of pumping capacitors in response to the control of the control logic 140. Meanwhile, the voltage generator 150 may further include a voltage regulator in addition to the plurality of pumping capacitors.

Figure 3:
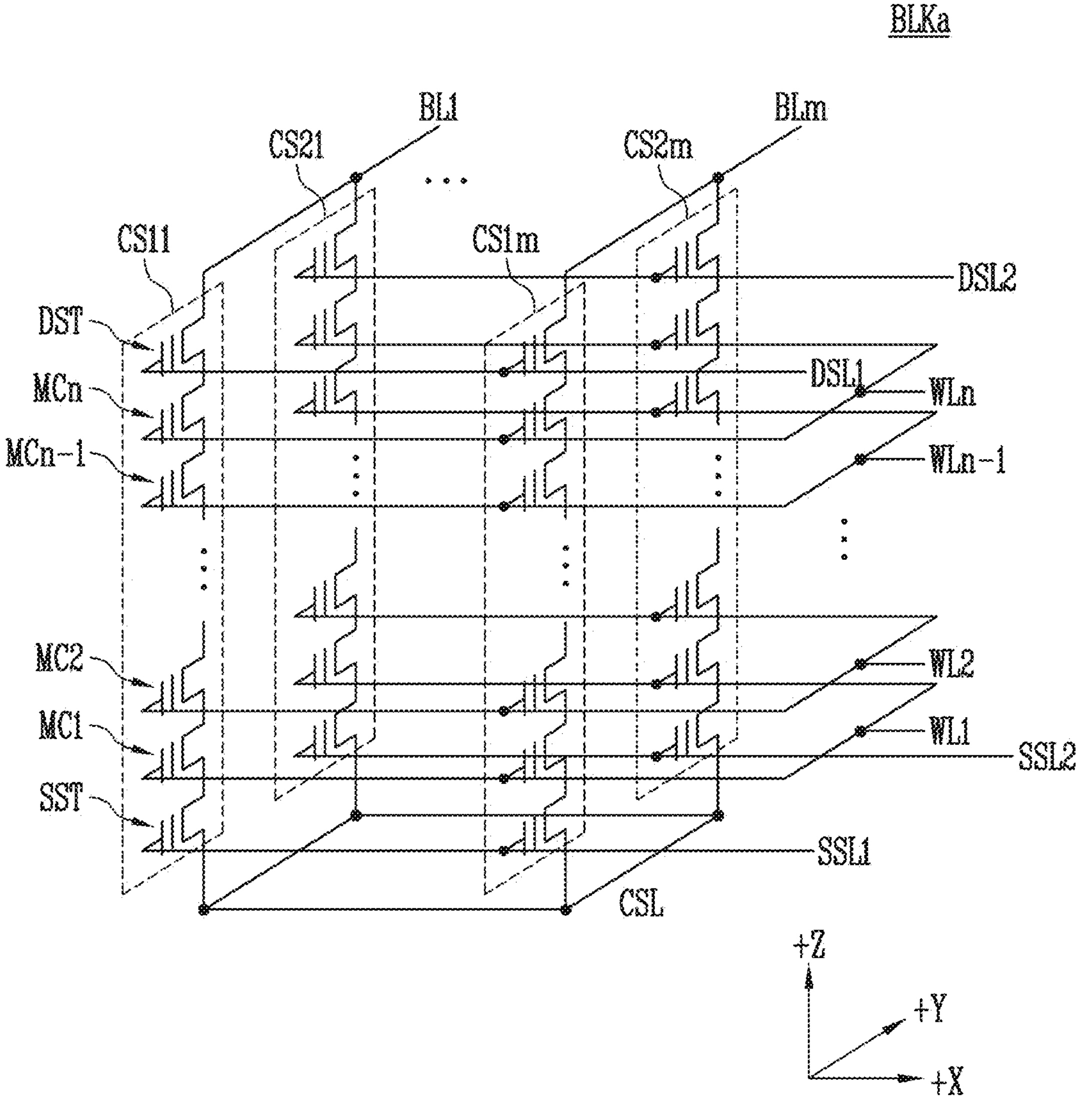
FIG. 3 is a circuit diagram illustrating any one memory block BLKa among the memory blocks BLK1 to BLKz of FIG. 2.

FIG. 3 is a circuit diagram illustrating any one memory block BLKa, among the memory blocks BLK1 to BLKz of FIG. 2.

Referring to FIG. 3, the memory block BLKa may include a plurality of cell strings CS11 to CS1*m* and CS21 to CS2*m*. In an embodiment, each of the plurality of cell strings CS11 to CS1*m* and CS21 to CS2*m* may be formed along +Z direction. In the memory block BLKa, m cell strings may be arranged in a row direction (that is, the +X direction). In FIG. 3, two cell strings may be arranged in a column direction (that is, the +Y direction). However, this is for convenience of description, and it may be understood that three or more cell strings may be arranged in the column direction.

Each of the plurality of cell strings CS11 to CS1*m* and CS21 to CS2*m* may include at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be connected between a common source line CSL and the memory cells MC1 to MCn.

Figure 4:
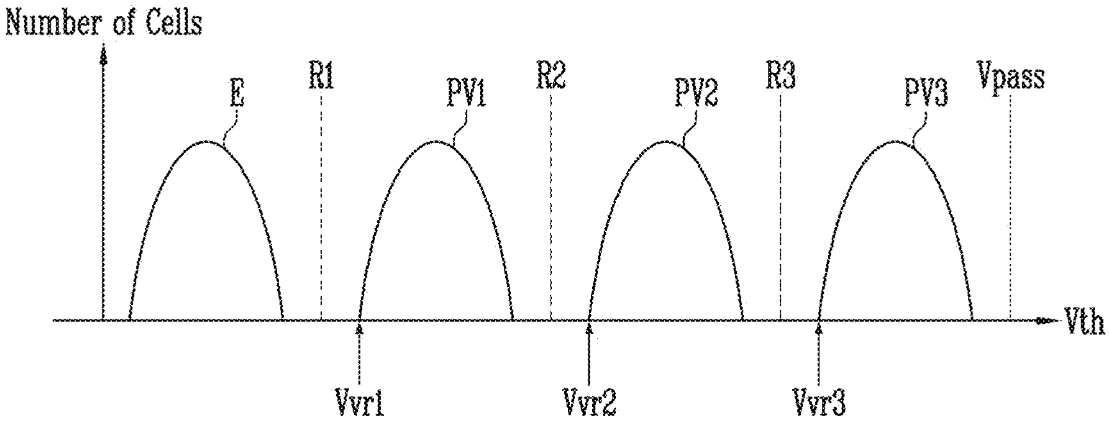
FIG. 4 is a graph illustrating a threshold voltage distribution of a multi-level cell.

In an embodiment, the source select transistors of the cell strings that are arranged in the same row may be connected to a source select line that extends in the row direction, and the source select transistors of the cell strings that are arranged in different rows may be connected to different source select lines. In FIG. 4, the source select transistors of the cell strings CS11 to CS1*m* of a first row may be connected to a first source select line SSL1. The source select transistors of the cell strings CS21 to CS2*m* of a second row may be connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string may be connected between the source select transistor SST and the drain select transistor DST.

The drain select transistor DST of each cell string may be connected between a corresponding bit line and the memory cells MC1 to MCn. The drain select transistor DST of cell strings that are arranged in the row direction may be connected to the drain select line extending in the row direction. The drain select transistors of the cell strings CS11 to CS1*m* of the first row may be connected to a first drain select line DSL1. The drain select transistors of the cell strings CS21 to CS2*m* of the second row may be connected to a second drain select line DSL2.

The cell strings that are arranged in the column direction may be connected to the bit lines that extend in the column direction. In FIG. 4, the cell strings CS11 and CS21 of the first column may be connected to the first bit line BL1. The cell strings CS1*m* and CS2*m* of the m-th column may be connected to the m-th bit line BLm.

The memory cells that are connected to the same word line in the cell strings that are arranged in the row direction may configure one page. For example, the memory cells that are connected to the first word line WL1, among the cell strings CS11 to CS1*m* of the first row may configure one page. The memory cells that are connected to the first word line WL1, among the cell strings CS21 to CS2*m* of the second row, may configure another page. The cell strings that are arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings, among the cell strings CS11 to CS1*m* or CS21 to CS2*m* that are arranged in the row direction, may be connected to the even bit lines, respectively, and odd-numbered cell strings, among the cell strings CS11 to CS1*m* or CS21 to CS2*m* that are arranged in the row direction, may be connected to odd bit lines, respectively.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As more dummy memory cells are provided, operational reliability for the memory block BLKa may improve, but the size of the memory block BLKa may increase. On the other hand, as less memory cells are provided, the size of the memory block BLKa may decrease, but the operational reliability for the memory block BLKa may deteriorate.

In order to efficiently control at least one dummy memory cell, each of the dummy memory cells may have a required threshold voltage. Before or after an erase operation for the memory block BLKa, program operations for all or a part of the dummy memory cells may be performed.

The memory block BLKa, shown in FIG. 3, has a three-dimensional structure, but the present disclosure is not limited thereto. For example, the memory cell array of the semiconductor memory device, according to the present disclosure, may include a memory block having a two-dimensional structure.

FIG. 4 is a graph illustrating a threshold voltage distribution of a multi-level cell.

Referring to FIG. 4, a threshold voltage of a multi-level cell (MLC) may be included in any one of an erase state E, a first program state PV1, a second program state PV2, and a third program state PV3. The semiconductor memory device and a method of operating the same, according to the present disclosure, might not be applied only to the MLC but also a triple-level cell (TLC), a quad-level cell (QLC), or a memory cell that stores data of five or more bits. However, for convenience of discussion, the following description is based on the MLC.

During the read operation, a first read voltage R1 may be applied to the selected word line to distinguish the erase state E from the first program state PV1. In addition, a second read voltage R2 may be applied to the selected word line to distinguish the first program state PV1 from the second program state PV2. Meanwhile, a third read voltage R3 may be applied to the selected word line to distinguish the second program state PV2 from the third program state PV3. During the read operation, a read pass voltage Vpass may be applied to the unselected word lines. Meanwhile, in a verify operation that is performed during the program operation, first to third verify voltages Vvr1, Vvr2, and Vvr3 may be used for the verify operation for the first to third program states PV1, PV2, and PV3.

Figure 5:
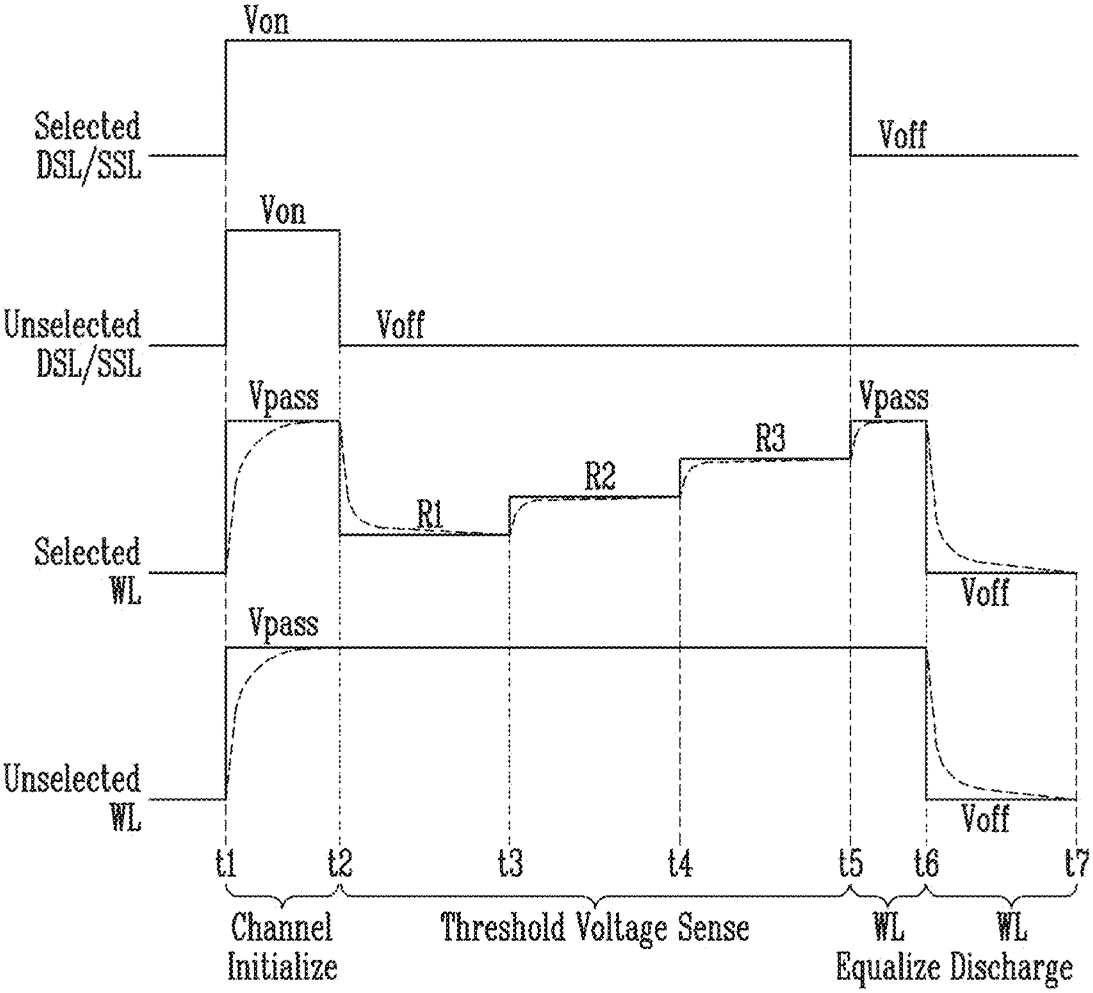
FIG. 5 is a timing diagram illustrating an example of a read operation of the semiconductor memory device.

FIG. 5 is a timing diagram illustrating an example of the read operation of the semiconductor memory device.

Referring to FIG. 5, the read operation on the selected memory cells may be performed based on a method of operating a semiconductor memory device according to an embodiment of the present disclosure. The read operation of the selected memory cells may include a channel initialization step, a threshold voltage sensing step of the selected memory cells, a word line equalize step, and a word line discharge step. In FIG. 5, the channel initialization step may be performed during a period t1 to t2, the threshold voltage sensing step may be performed during a period t2 to t5, the word line equalize step may be performed during a period t5 to t6, and the word line discharge step may be performed during a period t6 to t7.

At time t1, a turn-on voltage Von may be applied to selected drain select line and source select line, and the turn-on voltage Von may also be applied to unselected drain select line and source select line. Meanwhile, the read pass voltage Vpass may be applied to the selected word line that is connected to memory cells to be read, and the read pass voltage may also be applied to the unselected word lines. In a state in which the turn-on voltage Von is applied to the drain select lines and the source select lines, the read pass voltage Vpass may be applied to all word lines, and thus, a channel initialization operation may be performed.

An application of the read pass voltage Vpass to the selected word line and the unselected word lines during the period t1 to t2 is shown by a solid line. However, due to an RC delay, a voltage of the selected word line and the unselected word lines may increase as shown by a dotted line. In consideration of the RC delay of the word lines, the period t1 to t2 may be determined so that sufficient time is given for the voltage of the word lines to increase to the read pass voltage Vpass.

At time t2, a turn-off voltage Voff may be applied to the unselected drain select line and source select line. The turn-off voltage Voff may be a voltage capable of turning off the drain select transistor and the source select transistor, and in an embodiment, the turn-off voltage Voff may be a ground voltage. As shown in FIG. 3 or 4, when two cell strings are arranged in a column direction (that is, a +Y direction), a drain select line and a source select line that are connected to cell strings, which include the memory cells to be read, may become the selected drain select line and source select line, respectively. Meanwhile, a drain select line and a source select line that are connected to cell strings, which do not include the memory cells to be read, may become the unselected drain select line and source select line, respectively. Meanwhile, the turn-on voltage Von may be continuously applied to the selected drain select line and source select line.

At time t2, the first read voltage R1 may be applied to the selected word line. During the period t2 to t3, whether the threshold voltage of the selected memory cells is higher than the first read voltage R1 may be determined. An application of the first read voltage R1 to the selected word line during the period t2 to t3 is shown by a solid line. However, due to the RC delay, the voltage of the selected word line may decrease as shown by a dotted line. In consideration of the RC delay, the period t2 to t3 may be determined so that sufficient time is given for the voltage of the selected word line to decrease to the first read voltage R1. Hereinafter, the overlapping description of the dotted line related to the RC delay has been omitted.

At time t3, the second read voltage R2 may be applied to the selected word line. During the period t3 to t4, whether the threshold voltage of the selected memory cells is higher than the second read voltage R2 may be determined. In addition, at time t4, the third read voltage R3 may be applied to the selected word line. During the period t4 to t5, it may be determined whether the threshold voltage of the selected memory cells is higher than the third read voltage R3.

At time t5, the turn-off voltage Voff may be applied to the selected drain select line DSL and source select line SSL. Meanwhile, in order to equalize the word lines at time t5, an equalizing voltage may be applied to the selected word line and the unselected word line. In the example of FIG. 5, the equalizing voltage is shown to be equal to the read pass voltage Vpass. However, this is merely an example, and the equalizing voltage may be determined to be different from the read pass voltage Vpass.

At time t6, the turn-off voltage Voff may be applied to the word lines, which results in the word line discharge operation being performed. The period t6 to t7 in which the word line discharge operation is performed may be determined so that sufficient time is given for the voltage of the word lines to decrease in consideration of the RC delay. The read operation may be ended after time t7.

Referring to FIG. 5, the first read voltage R1 may be applied to the selected word line during the period t2 to t3, the second read voltage R2 may be applied to the selected word line during the period t3 to t4, and the third read voltage R3 may be applied to the selected word line during the period t4 to t5. That is, read voltages may be sequentially applied, from the lowest read voltage R1 to the highest read voltage R3, according to sizes of the read voltages. In this case, the difference between the read pass voltage Vpass that is applied to the selected word line during the period t1 to t2 and the first read voltage R1 that is applied to the selected word line during the period t2 to t3 may be relatively large.

Figure 6:
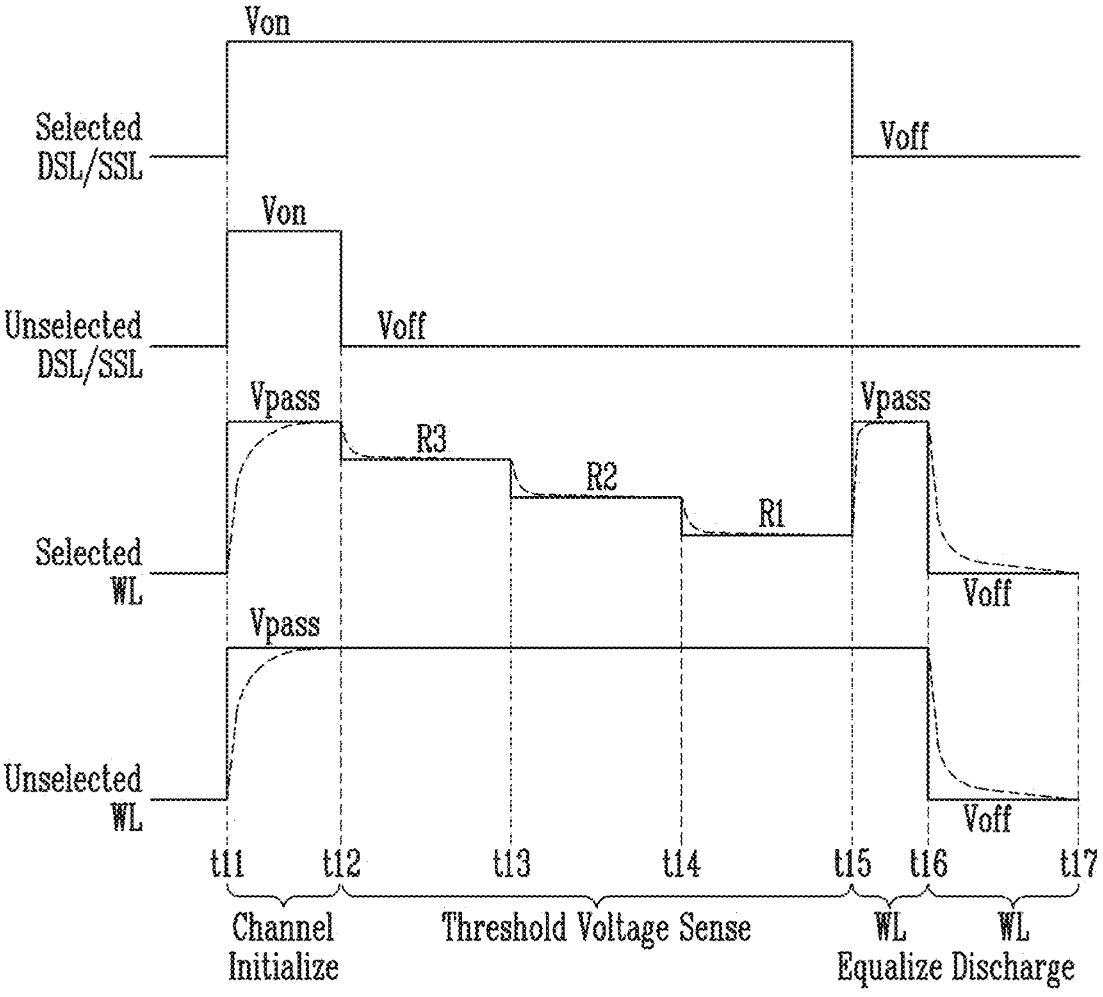
FIG. 6 is a timing diagram illustrating another example of the read operation of the semiconductor memory device.

FIG. 6 is a timing diagram illustrating another example of the read operation of the semiconductor memory device.

Referring to FIG. 6, the read operation may be performed in a method similar to the operation method as shown in FIG. 5, except that read voltages may be sequentially applied to the selected word line from the highest read voltage R3 to the lowest read voltage R1. Therefore, overlapping descriptions have been omitted.

In FIG. 6, the channel initialization step may be performed during a period t11 to t12, the threshold voltage sensing step may be performed during a period t12 to t15, the word line equalize step may be performed during a period t15 to t16, and the word line discharge step may be performed during a period t16 to t17.

At time t11, the turn-on voltage Von may be applied to the selected drain select line and source select line, and the turn-on voltage Von may also be applied to the unselected drain select line and source select line. Meanwhile, the read pass voltage Vpass may be applied to the selected word line that is connected to the memory cells to be read, and the read pass voltage may also be applied to the unselected word lines. In a state in which the turn-on voltage Von is applied to the drain select lines and source select lines, the read pass voltage Vpass may be applied to all word lines, and thus, the channel initialization operation may be performed.

At time t12, the turn-off voltage Voff may be applied to the unselected drain select line and source select line. Meanwhile, the turn-on voltage Von may be continuously applied to the selected drain select line and source select line.

At time t12, the third read voltage R3 may be applied to the selected word line. During the period t2 to t3, whether the threshold voltage of the selected memory cells is higher than the third read voltage R3 may be determined. At time t13, the second read voltage R2 may be applied to the selected word line. During the period t13 to t14, whether the threshold voltage of the selected memory cells is higher than the second read voltage R2 may be determined. In addition, at time t14, the first read voltage R1 may be applied to the selected word line. During the period t14 to t15, whether the threshold voltage of the selected memory cells is higher than the first read voltage R1 may be determined.

At time t15, the turn-off voltage Voff may be applied to the selected drain select line DSL and source select line SSL. Meanwhile, in order to equalize the word lines at time t15, the equalizing voltage may be applied to the selected word line and the unselected word line. In the example of FIG. 6, the equalizing voltage is shown as being equal to the read pass voltage Vpass. However, this is merely an example, and the equalizing voltage may be determined to be different from the read pass voltage Vpass.

At time t16, the turn-off voltage Voff may be applied to the word lines, which results in the word line discharge operation being performed. The period t16 to t17 in which the word line discharge operation is performed may be determined so that the sufficient time is given for voltage of the word lines to decrease in consideration of the RC delay. The read operation may be ended after time t17.

Figure 7:
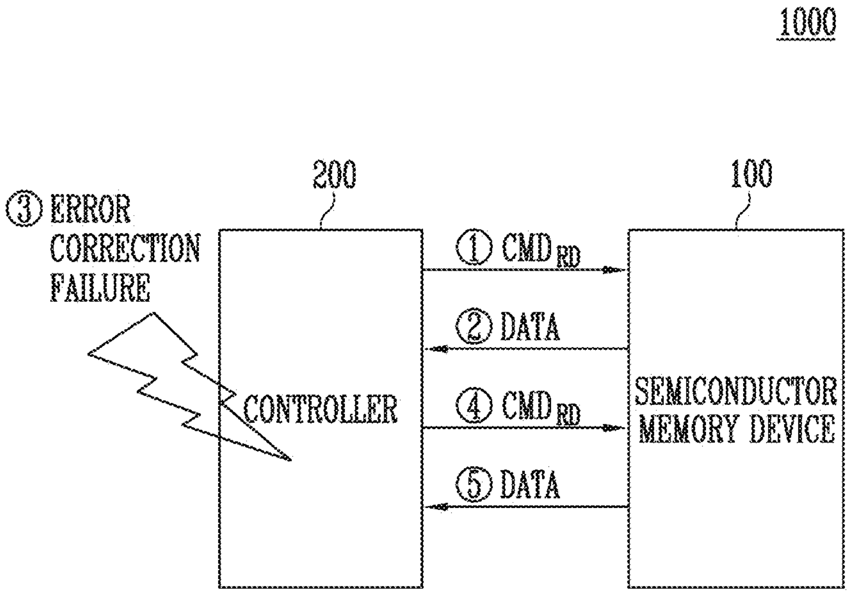
FIG. 7 is a diagram illustrating an operation of a controller and a semiconductor memory device when error correction for read data fails.

FIG. 7 is a diagram illustrating an operation of a controller and a semiconductor memory device when error correction for read data fails.

Referring to FIG. 7, the controller 200 may transmit a read command $CMD_{RD}$ to the semiconductor memory device 100 (①). In response to the received read command $CMD_{RD}$, the semiconductor memory device 100 may perform a read operation. Meanwhile, the semiconductor memory device 100 may transmit read data DATA to the controller 200 (②). The controller 200 may perform an error correction operation on the received data DATA.

When the received data DATA includes more error bits than a specific threshold value, the error correction operation may fail. When the error correction fails (③), the controller 200 may transmit the read command $CMD_{RD}$ for re-reading the corresponding data to the semiconductor memory device 100 (④). In this process, the controller 200 may control the semiconductor memory device to change a value of a read voltage that is used for the read operation. In response to the received read command $CMD_{RD}$, the semiconductor memory device 100 may perform the read operation again. According to an embodiment, the semiconductor memory device 100 may re-read the data at the same position at which the read operation was previously performed by using the changed read voltage. The semiconductor memory device 100 may transmit the re-read data DATA to the controller 200 (⑤). The controller 200 may perform the error correction operation on the received data DATA again.

As shown in FIG. 7, when the error correction for the read data fails, the same data may be re-read.

Figure 8:
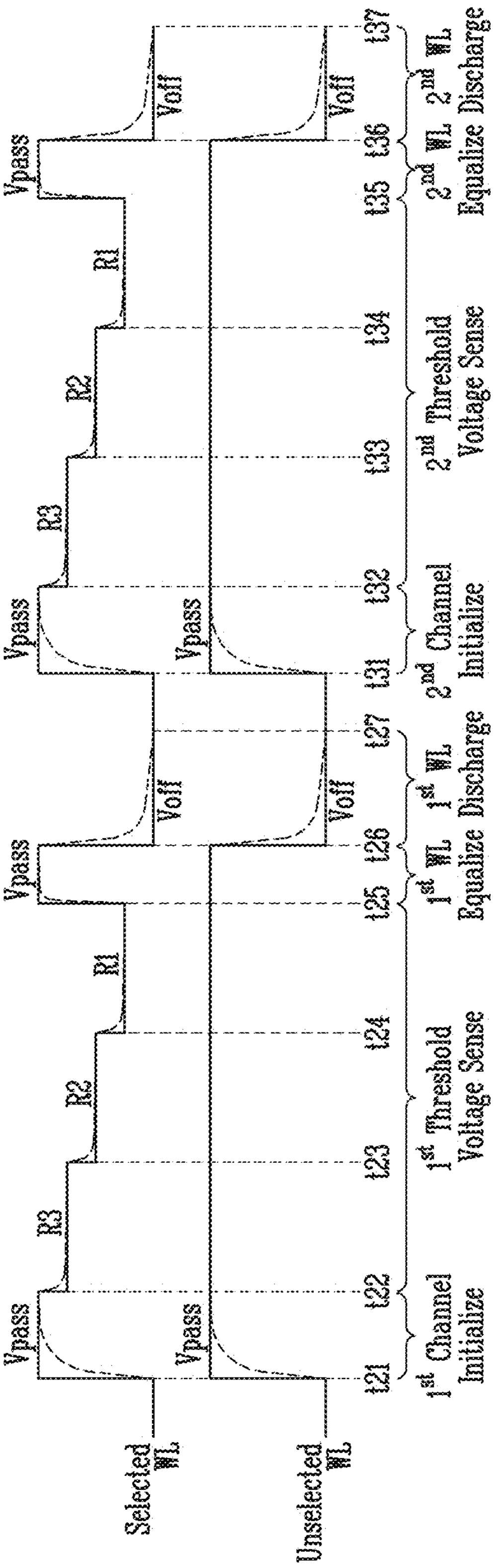
FIG. 8 is a timing diagram illustrating an operation of the semiconductor memory device according to an example of FIG. 7.

FIG. 8 is a timing diagram illustrating an operation of the semiconductor memory device according to an example of FIG. 7. FIG. 8 shows a timing diagram of the read operation using the method described with reference to FIG. 6. That is, in the timing diagram of FIG. 8, the read voltages may be sequentially applied to the selected word line from the highest read voltage R3 to the lowest read voltage R1. For convenience of discussion, in the timing diagram of FIG. 8, only the voltage of the word lines is shown, and the voltage of the drain select line and the source select line has been omitted.

When the controller 200 transmits a first read command $CMD_{RD}$ to the semiconductor memory device 100 (①)), the semiconductor memory device 100 may start a first read operation. Specifically, in a period t21 to t22, a first channel initialization step may be performed, and in a period t22 to t25, a first threshold voltage sensing step may be performed. In addition, a first word line equalizing step may be performed in a period t25 to t26, and a first word line discharging step may be performed in a period t26 to t27. A first read operation of the semiconductor memory device 100 may be performed in a period t21 to t27, and the read data may be transmitted to the controller 200 (②).

The controller 200 may perform the error correction operation on the received data. When error correction fails (③), the controller 200 may transmit the read command $CMD_{RD}$ to the semiconductor memory device 100 again (④). Accordingly, the semiconductor memory device 100 may start a second read operation. Specifically, in a period t31 to t32, a second channel initialization step may be performed, and in a period t32 to t35, a second threshold voltage sensing step may be performed. In addition, a second word line equalizing step may be performed in a period t35 to t36, and a second word line discharging step may be performed in a period t36 to t37. The second read operation of the semiconductor memory device 100 may be performed in a period t31 to t37, and the read data may be transmitted to the controller 200 (⑤).

In a successive read operation for a word line at the same position, since the RC delay indicated by the plurality of word lines is relatively large, the time that is required for the word line discharge operation may also be increased. Referring to FIG. 8, in two successive read operations, when the first word line discharge step that is performed after the first word line equalize step is performed is omitted, an entire read time may be reduced.

The controller 200 may also use a second type of read command that is transmitted when the read operation is repeatedly performed on the word line at the same position, in addition to a first type of read command for controlling a normal read operation of the semiconductor memory device 100. When the first type of read command is received, the semiconductor memory device 100 may perform the read operation including the word line discharge step in the read operation. Meanwhile, when the second type of read command is received, the semiconductor memory device 100 might not perform the word line discharge operation in the read operation. Meanwhile, the controller may use a word line discharge command for controlling the semiconductor memory device 100 to perform the word line discharge step after the read operation corresponding to the second type of read command is performed.

Figure 9A:
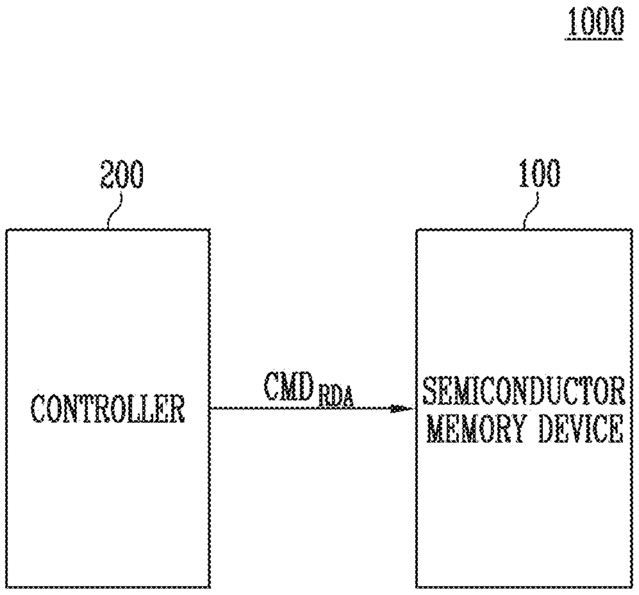
FIGS. 9A and 9B are diagrams illustrating a controller outputting a first type of read command and an operation of a semiconductor memory device based on the first type of read command in accordance with an embodiment of the present disclosure.
Figure 9B:
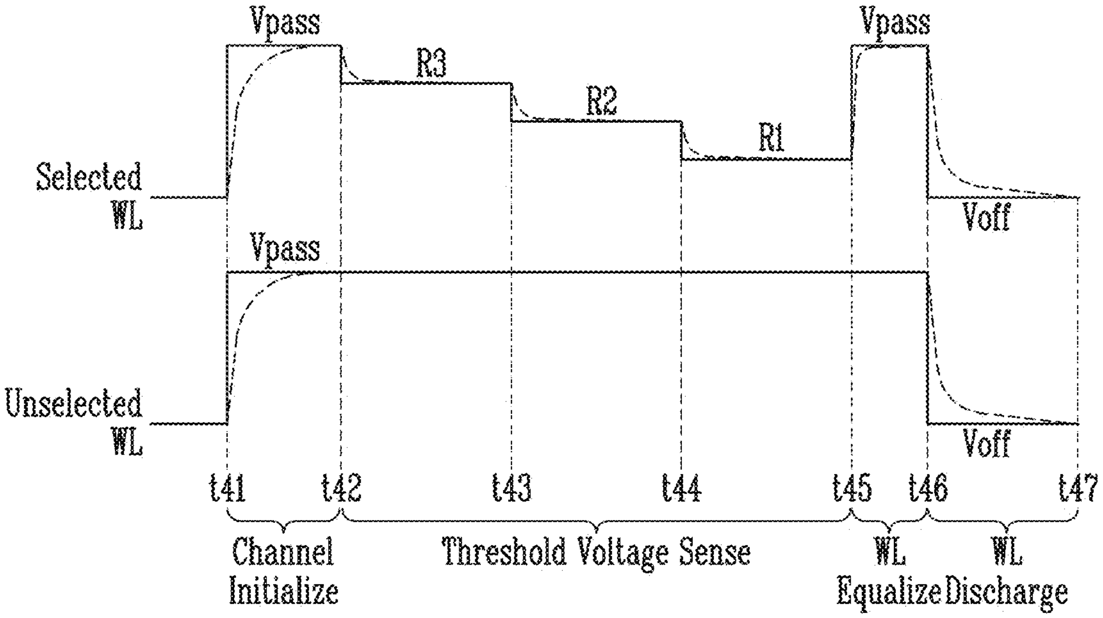

FIGS. 9A and 9B are diagrams illustrating a controller outputting a first type of read command and an operation of a semiconductor memory device based on the first type of read command in accordance with an embodiment of the present disclosure.

Referring to FIG. 9A, the controller 200 may transmit a first type of read command $CMD_{RDA}$ to the semiconductor memory device 100. When the semiconductor memory device 100 is to be controlled to perform the normal read operation, the controller 200 may transmit the first type of read command $CMD_{RDA}$ to the semiconductor memory device 100. In response to the first type of read command $CMD_{RDA}$, the semiconductor memory device 100 may perform the read operation including the word line discharge step.

More specifically, referring to FIG. 9B, in response to the first type of read command $CMD_{RDA}$, the semiconductor memory device 100 may perform the channel initialization step in a period t41 to t42, perform the threshold voltage sensing step in a period t42 to t45, perform the word line equalize step in a period t45 to t46, and perform the word line discharge step in a period t46 to t47. That is, the semiconductor memory device 100 may perform the read operation including the word line discharge step in response to the first type of read command $CMD_{RDA}$.

Figure 10A:
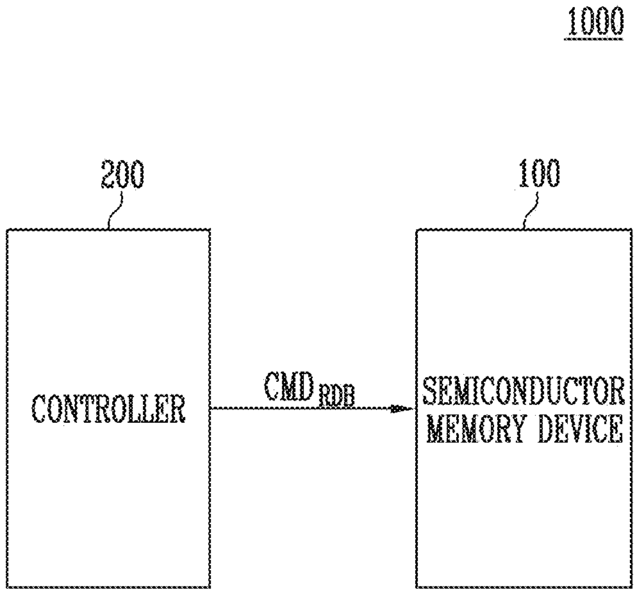
FIGS. 10A and 10B are diagrams illustrating a controller outputting a second type of read command and an operation of a semiconductor memory device based on the second type of read command in accordance with an embodiment of the present disclosure.
Figure 10B:
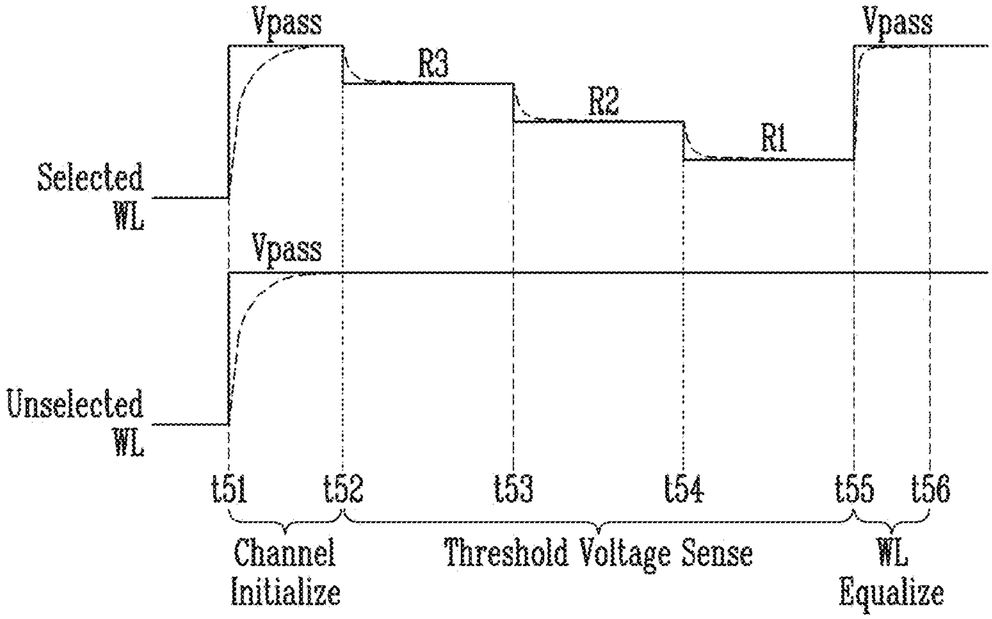

FIGS. 10A and 10B are diagrams illustrating a controller outputting a second type of read command and an operation of a semiconductor memory device based on the second type of read command in accordance with an embodiment of the present disclosure.

Referring to FIG. 10A, the controller 200 may transmit a second type of read command $CMD_{RDB}$ to the semiconductor memory device 100. When the semiconductor memory device 100 is to be controlled to repeatedly perform the read operation on the same word line position, the controller 200 may transmit the second type of read command $CMD_{RDB}$ to the semiconductor memory device 100. In response to the second type of read command $CMD_{RDB}$, the semiconductor memory device 100 may perform the read operation without the word line discharge step. More specifically, referring to FIG. 10B, in response to the second type of read command $CMD_{RDB}$, the semiconductor memory device 100 may perform the channel initialization step in a period t51 to t52, perform the threshold voltage sensing step in a period t52 to t55, and perform the word line equalize step in a period t55 to t56. That is, the semiconductor memory device 100 may perform the read operation without the word line discharge step in response to the second type of read command $CMD_{RDB}$. Accordingly, also after the semiconductor memory device 100 may perform the read operation according to the second type of read command $CMD_{RDB}$, the voltage of the word lines may maintain the read pass voltage Vpass.

Figure 11A:
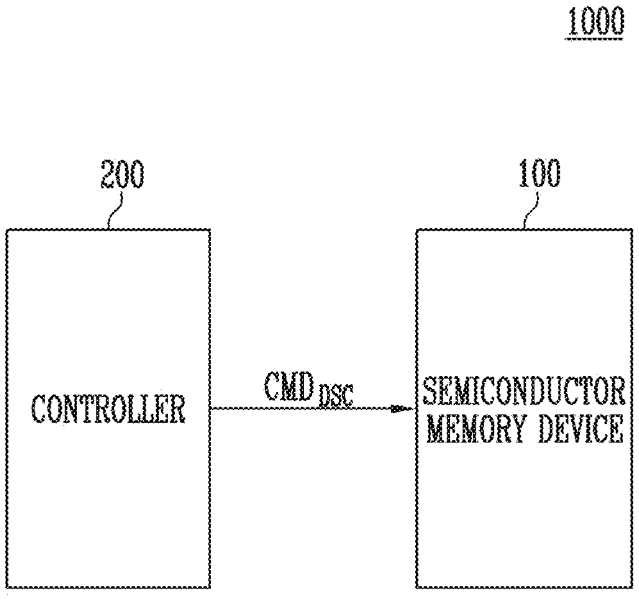
FIGS. 11A and 11B are diagrams illustrating a controller outputting a discharge command and an operation of a semiconductor memory device based on the discharge command in accordance with an embodiment of the present disclosure.
Figure 11B:
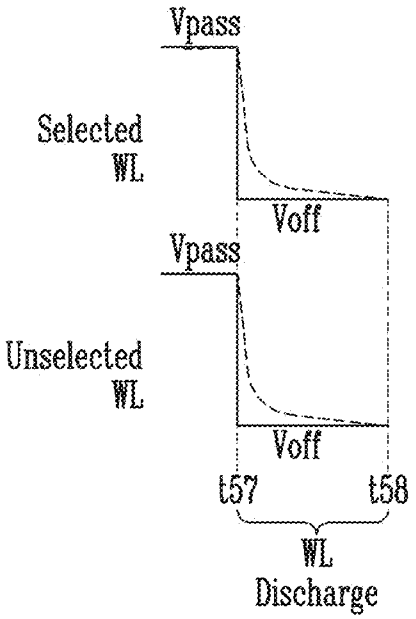

FIGS. 11A and 11B are diagrams illustrating a controller outputting a discharge command and an operation of a semiconductor memory device based on the discharge command in accordance with an embodiment of the present disclosure.

As shown in FIGS. 10A and 10B, at a specific time point after repeatedly performing the read operation corresponding to the second type of read command $CDM_{RDB}$, the semiconductor memory device 100 may no longer need to perform the read operation based on the second type of read command $CDM_{RDB}$. In this case, the controller 200 may transmit a discharge command $CMD_{DSC}$ for controlling the semiconductor memory device 100 to perform the word line discharge operation to the semiconductor memory device 100. The semiconductor memory device 100 may apply a turn-off voltage to the word lines maintaining the read pass voltage Vpass in response to the discharge command $CMD_{DSC}$.

Figure 12A:
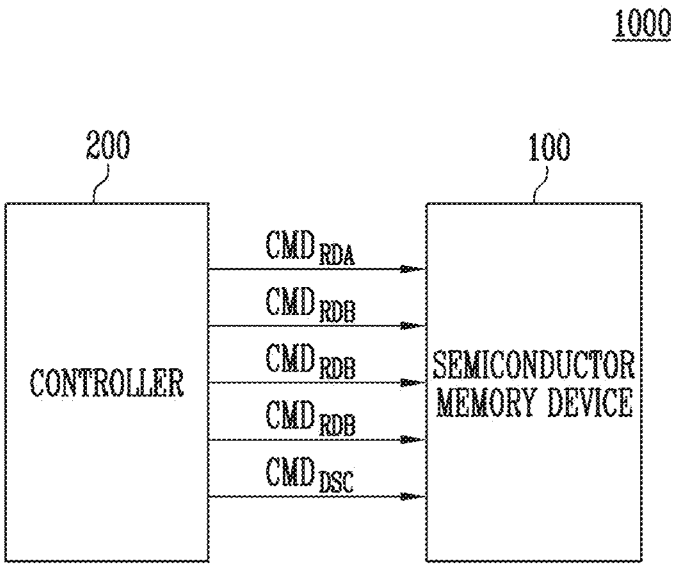
FIGS. 12A and 12B are diagrams illustrating a controller using first type and second type of read commands together and an operation of a semiconductor memory device based on the first type and the second type of read commands.
Figure 12B:
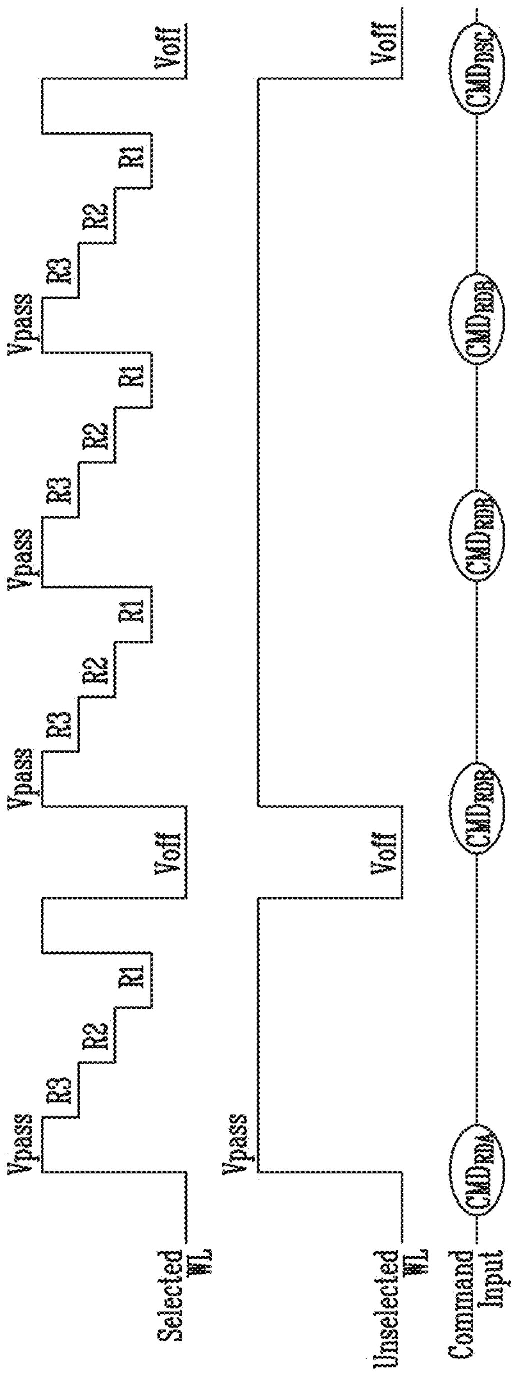

FIGS. 12A and 12B are diagrams illustrating a controller using first type and second type of read commands together and an operation of a semiconductor memory device based on the first type and the second type of read commands.

Referring to FIG. 12A, only commands that are transmitted from the controller 200 to the semiconductor memory device 100 are shown, and data that is transmitted from the semiconductor memory device 100 to the controller 200 has been omitted. The controller 200 may first transmit the first type of read command $CMD_{RDA}$ to the semiconductor memory device 100. When error correction for read data corresponding to the first type of read command CMDRDA fails, the controller 200 may determine to repeatedly perform the read operation on word lines at the same position. Therefore, the controller 200 may transmit the second type of read command $CMD_{RDB}$ to the semiconductor memory device 100 in order to reduce the read time. In an embodiment, the controller 200 may transmit the second type of read command $CMD_{RDB}$ to the semiconductor memory device 100 until an error correction operation on the received data is successful. Alternatively, the controller 200 may transmit the second type of read command $CMD_{RDB}$ to the semiconductor memory device 100 a predetermined number of times even though the error correction operation on the received data is not finally successful.

According to that shown in FIG. 12A, after transmitting the first type of read command $CMD_{RDA}$ to the semiconductor memory device 100, the controller 200 may transmit the second type of read command $CMD_{RDB}$ to the semiconductor memory device 100 three times. Accordingly, the semiconductor memory device 100 may perform a total of four read operations. Finally, the controller 200 may transmit the discharge command $CMD_{DSC}$ to the semiconductor memory device 100.

Referring to FIG. 12B, a command that is input to the semiconductor memory device 100 and a read operation corresponding thereto are shown in terms of a voltage that is applied to the word line. A first read operation may be performed in response to a first input first type of read command $CMD_{RDA}$. The first read operation that is performed in response to the first type of read command $CMD_{RDA}$ may include the word line discharge operation. That is, a step of decreasing a voltage of the selected word line and the unselected word line to the turn-off voltage may be included in the first read operation.

Meanwhile, a second input read command may be the second type of read command $CMD_{RDB}$. The second read operation that is performed in response to the second type of read command $CMD_{RDB}$ might not include the word line discharge operation. Accordingly, the voltage of the word lines may maintain the read pass voltage Vpass even though the second read operation has been completed.

Meanwhile, a third input read command may be the second type of read command $CMD_{RDB}$. A third read operation may be performed in response to the third input read command. Since the voltage of the word lines is maintained even after the previous second read operation, the channel initialization step may also be omitted in the third read operation. Alternatively, the time that is required for the channel initialization operation may be relatively shortened in the third read operation. In addition, the third read operation that is performed in response to the second type of read command $CMD_{RDB}$ might not include the word line discharge operation. Accordingly, the voltage of the word lines may maintain the read pass voltage Vpass even though the third read operation has been completed.

Meanwhile, a fourth input read command may be the second type of read command $CMD_{RDB}$. The overlapping description of the fourth read operation that is performed in response to the fourth input read command has been omitted.

After the fourth read operation is performed, the discharge command $CDM_{DSC}$ may be input to the semiconductor memory device 100. The semiconductor memory device 100 may apply the turn-off voltage to the word lines in response to the discharge command $CDM_{DSC}$.

Figure 13A:
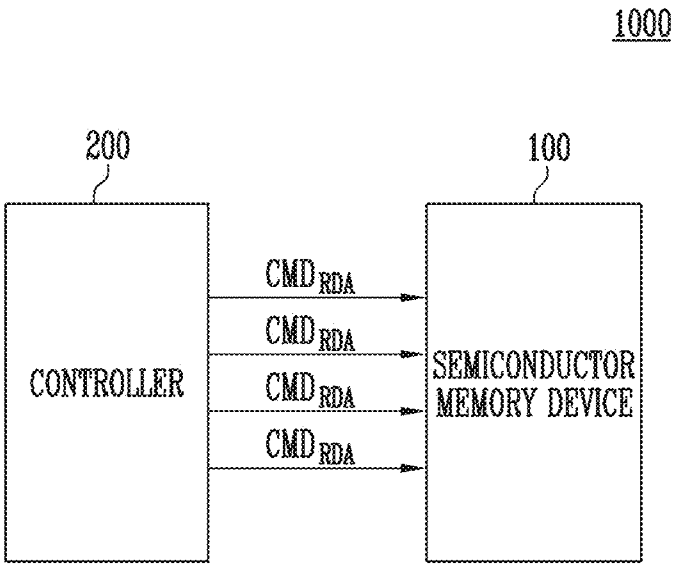
FIGS. 13A and 13B are diagrams illustrating a controller using only the first type of read command and an operation of a semiconductor memory device based on only the first type of read command.
Figure 13B:
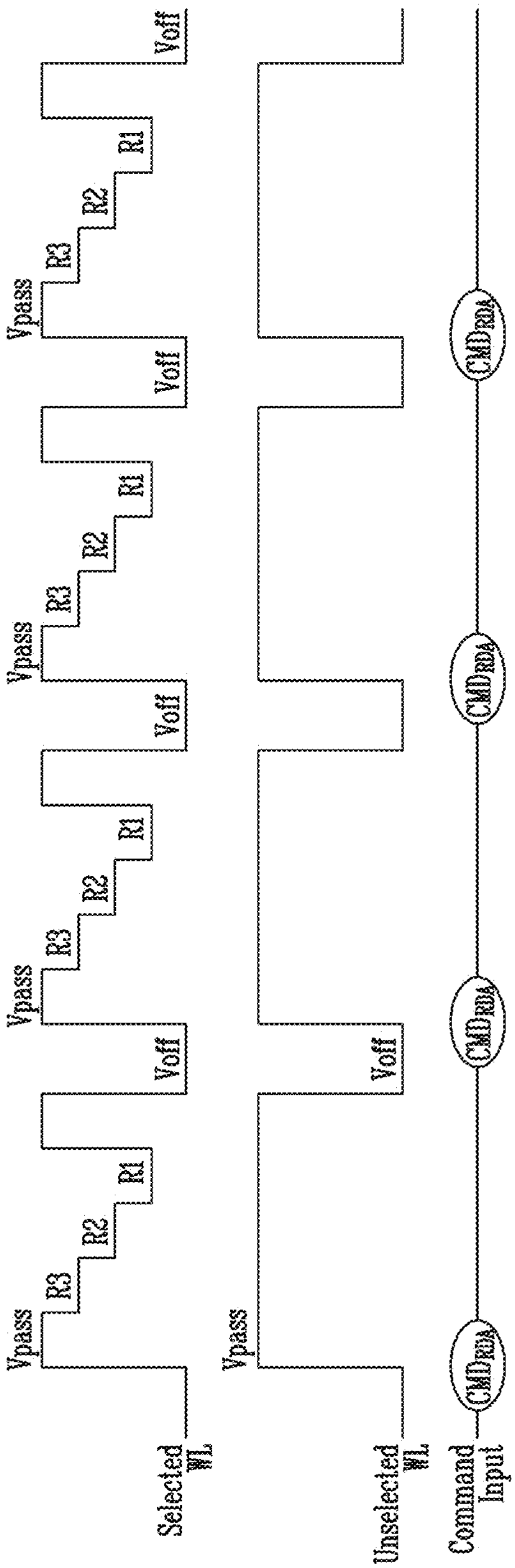

FIGS. 13A and 13B are diagrams illustrating a controller using only the first type of read command and an operation of a semiconductor memory device based on only the first type of read command.

Referring to FIG. 13A, the controller 200 may first transmit the first type of read command $CMD_{RDA}$ to the semiconductor memory device 100. When error correction for read data corresponding to the first type of read command $CMD_{RDA}$ fails, the first type of read command $CMD_{RDA}$ may be transmitted to the semiconductor memory device 100 again. In an embodiment, the controller 200 may transmit the first type of read command $CMD_{RDA}$ to the semiconductor memory device 100 until the error correction operation on the received data is successful. Alternatively, the controller 200 may transmit the first type of read command $CMD_{RDA}$ to the semiconductor memory device 100 a predetermined number of times even though the error correction operation on the received data is not finally successful. According to that shown in FIG. 13A, the controller 200 may transmit the first type of read command $CMD_{RDA}$ to the semiconductor memory device 100 four times. Accordingly, the semiconductor memory device 100 may perform a total of four read operations. Contrary to FIG. 12A, the controller 200 might not transmit the discharge command $CMD_{DSC}$ to the semiconductor memory device 100.

Referring to FIG. 13B, the command that is input to the semiconductor memory device 100 and the read operation corresponding thereto are shown in terms of the voltage that is applied to the word line. The first read operation may be performed in response to the first input first type of read command $CMD_{RDA}$. The first read operation that is performed in response to the first type of read command $CMD_{RDA}$ may include the word line discharge operation. That is, a step of decreasing the voltage of the selected word line and the unselected word line to the turn-off voltage may be included in the first read operation.

Meanwhile, the second read operation may be performed in response to the second input first type of read command $CMD_{RDA}$. The second read operation that is performed in response to the first type of read command $CMD_{RDA}$ may also include the word line discharge step. In response to the third and fourth input first type of read commands $CMD_{RDA}$, the semiconductor memory device 100 may repeatedly perform the read operation including the word line discharge step. Therefore, the overlapping description of the read operation corresponding to the first type of read command $CMD_{RDA}$ has been omitted.

As shown in FIG. 13B, when the read operation corresponding to the first type of read command $CMD_{RDA}$ is repeatedly performed, each of the read operations may include both the word line discharge step and the channel initialization step. As described above, since the RC delay, indicated by the plurality of word lines, is relatively large, the time that is required for the word line discharge operation or the channel initialization operation may also be relatively longer.

Referring to FIGS. 12B and 13B together, it may be seen that the time that is required for the total of four read operations in the read operation in a case of FIG. 12B may be shorter than that of a case of FIG. 13B. That is, when it is expected that a read operation will be repeatedly performed at the same position, an entire read time may be reduced by appropriately using the second type of read command $CMD_{RDB}$, which omits the word line discharge step.

Figure 14:
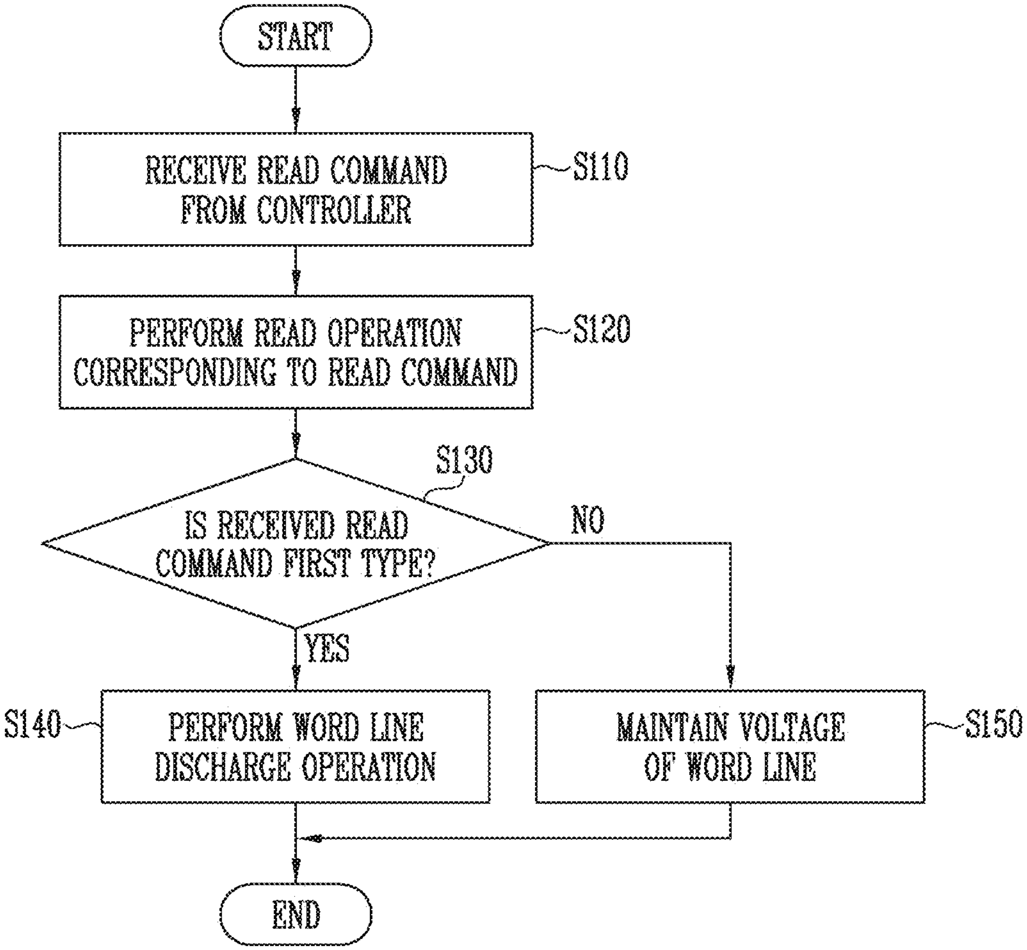
FIG. 14 is a flowchart illustrating an operation of a semiconductor memory device according to an embodiment of the present disclosure.

FIG. 14 is a flowchart illustrating an operation of a semiconductor memory device according to an embodiment of the present disclosure. Referring to FIG. 14, the operation of the semiconductor memory device according to an embodiment of the present disclosure may include receiving the read command from the controller (S110), performing the read operation corresponding to the received read command (S120), and determining whether the received read command is the first type of read command (S130). Meanwhile, the operation of the semiconductor memory device may further include performing the word line discharge operation (S140) when the received read command is the first type of read command (S130: Yes). In addition, the operation of the semiconductor memory device may further include maintaining the voltage of the word line when the received read command is the second type of read command, which is not the first type of read command (S130: No) (S150).

In step S110, the semiconductor memory device 100 may receive the read command from the controller 200. In response to the received read command and an address corresponding thereto, the semiconductor memory device 100 may perform the read operation corresponding to the read command (S120). Step S120 may correspond to an operation that is performed in the period t41 to t46 of FIG. 9B or the period t51 to t56 of FIG. 10B. A detailed configuration of step S120 is described with reference to FIG. 15.

Thereafter, the semiconductor memory device may determine whether the received read command is the first type of read command (S130). When the received read command is the first type of read command (S130: Yes), the semiconductor memory device 100 may perform the word line discharge operation (S140). The word line discharge operation of step S140 may correspond to the period t46 to t47 of FIG. 9B.

When the received read command is the second type of read command (S130: No), the semiconductor memory device 100 might not perform the word line discharge operation and may maintain the voltage of the word line (S150). Step S150 may correspond to a period after time t56 of FIG. 10B.

Figure 15:
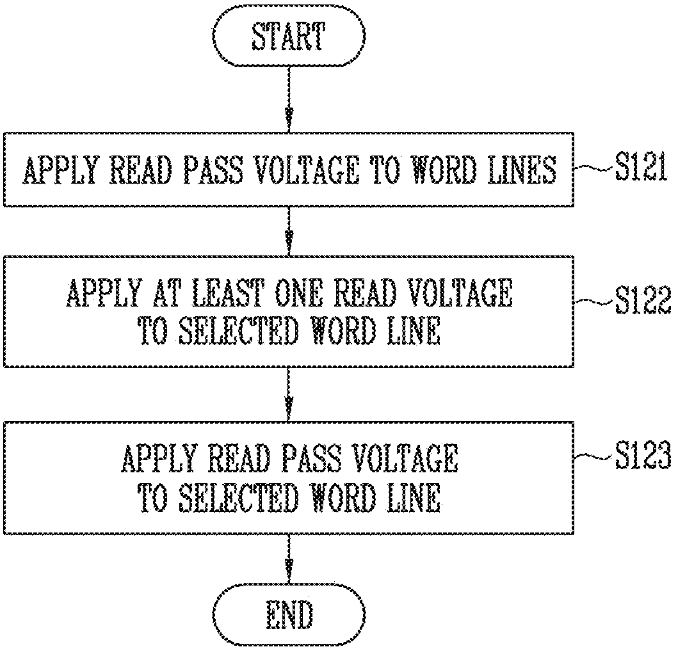
FIG. 15 is a flowchart illustrating an exemplary embodiment of step S120 shown in FIG. 14.

FIG. 15 is a flowchart illustrating an exemplary embodiment of step S120 shown in FIG. 14.

Referring to FIG. 15, performing the read operation corresponding to the received read command (S120) may include applying the read pass voltage to the word lines (S121), applying at least one read voltage to the selected word line, and applying the read pass voltage to the selected word line (S123).

Applying the read pass voltage to the word lines (S121) may correspond to the channel initialization step and may correspond to an operation that is performed in the period t41 to t42 of FIG. 9B or the period t51 to t52 of FIG. 10B. In addition, applying at least one read voltage to the selected word line (S122) may correspond to the threshold voltage sensing step and may correspond to an operation that is performed in the period t42 to t45 of FIG. 9B or the period t52 to t55 of FIG. 10B. Meanwhile, applying the read pass voltage to the selected word line (S123) may correspond to the word line equalize step and may correspond to an operation that is performed in the period t45 to t46 of FIG. 9B or the period t55 to t56 of FIG. 10B.

Figure 16:
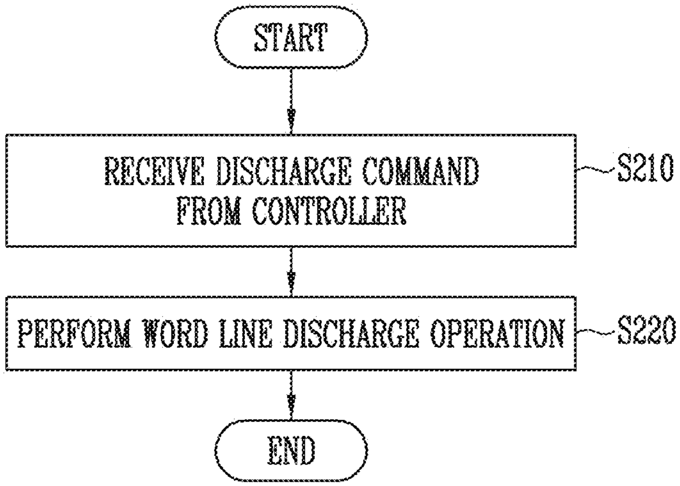
FIG. 16 is a flowchart illustrating an operation of a semiconductor memory device according to another embodiment of the present disclosure.

FIG. 16 is a flowchart illustrating an operation of a semiconductor memory device according to another embodiment of the present disclosure. Specifically, steps shown in FIG. 16 may be performed to discharge the word line after the read operation according to the second type of read command. That is, the steps shown in FIG. 16 may be performed after the step S150 of FIG. 14.

Referring to FIG. 16, the operation of the semiconductor memory device according to another embodiment of the present disclosure may include receiving the discharge command $CMD_{DSC}$ from the controller 200 (S210) and performing the word line discharge operation in response to the discharge command $CMD_{DSC}$ (S220). As described above, receiving the discharge command $CMD_{DSC}$ (S210) may be performed in a state in which the word lines maintain the read pass voltage. That is, step S210 may be performed after step S150 of FIG. 14. Performing the word line discharge operation (S220) may correspond to the operation of applying the turn-off voltage to the selected word line and the unselected word line and may correspond to an operation that is performed in the period t57 to t58 of FIG. 11B.

Figure 17:
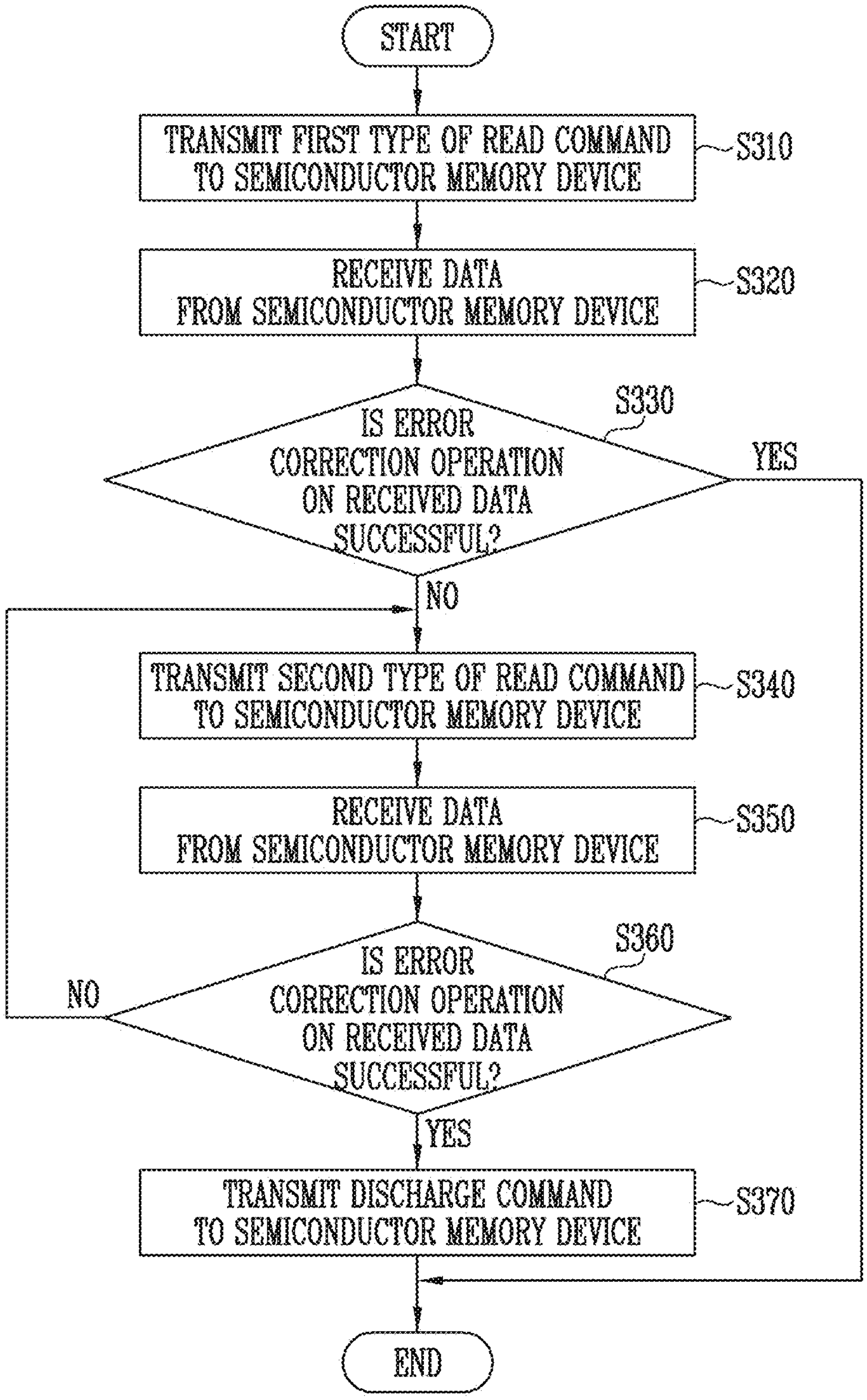
FIG. 17 is a flowchart illustrating an operation of a controller according to an embodiment of the present disclosure.

FIG. 17 is a flowchart illustrating an operation of a controller according to an embodiment of the present disclosure.

Referring to FIG. 17, the operation of the controller 200 may include transmitting the first type of read command $CMD_{RDA}$ to the semiconductor memory device (S310), receiving data from the semiconductor memory device (S320), and determining whether the error correction operation on the received data is successful (S330). When the error correction operation on the received data is successful (S330: Yes), the operation of the controller may be ended.

When the error correction operation on the received data fails (S330: No), the controller may determine that the semiconductor memory device re-performs the read operation. Accordingly, the operation of the controller may further include transmitting the second type of read command $CMD_{RDB}$ to the semiconductor memory device (S340) when the error correction operation on the received data fails (S330: No), receiving data from the semiconductor memory device (S350), and determining whether the error correction operation on the received data is successful (S360). When the error correction operation on the received data is successful (S360: Yes), the controller may control the semiconductor memory device to perform the word line discharge operation. Accordingly, the operation of the controller may further include transmitting the discharge command $CMD_{DSC}$ to the semiconductor memory device when the error correction operation on the received data is successful (S360: Yes) (S370).

When the error correction operation on the received data fails (S360: No), the controller may determine that the semiconductor memory device re-performs the read operation. Accordingly, when the error correction operation on the received data fails (S360: No), the controller 200 may return to step S340 to control the semiconductor memory device to repeatedly perform the read operation that omits the word line discharge operation. As shown in FIG. 17, a process of transmitting the second type of read command to the semiconductor memory device (S340), receiving data from the semiconductor memory device (S350), and performing the error correction operation on the received data may be repeated until the error correction operation on the received data is successful. Alternatively, a process of transmitting the second type of read command to the semiconductor memory device (S340), receiving data from the semiconductor memory device (S350), and performing the error correction operation on the received data may be repeated only a predetermined number of times.

Referring to FIG. 17, when the error correction operation fails in step S330, transmitting the second type of read command to the semiconductor memory device may be performed. However, this is exemplary and the present disclosure is not limited thereto. That is, according to an example of FIG. 17, when the error correction operation fails, the controller 200 may determine that the semiconductor memory device re-performs the read operation. However, the controller 200 may determine that the semiconductor memory device re-performs the read operation based on various factors other than an error correction failure.

Figure 18:
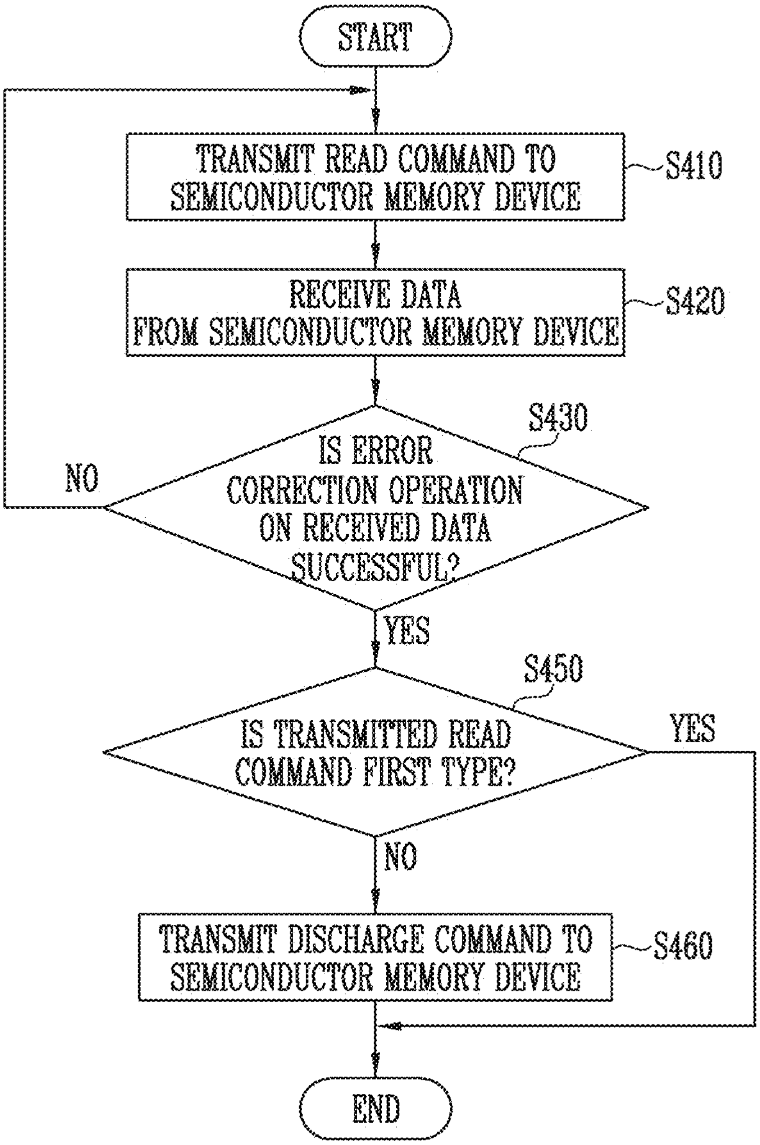
FIG. 18 is a flowchart illustrating an operation of a controller according to another embodiment of the present disclosure.

FIG. 18 is a flowchart illustrating an operation of a controller according to another embodiment of the present disclosure. FIG. 18 is a flowchart illustrating the operation of the controller according to the present disclosure from a viewpoint different from that of FIG. 17.

Referring to FIG. 18, the operation of the controller may include transmitting the read command to the semiconductor memory device (S410), receiving data from the semiconductor memory device (S420), determining whether the error correction operation on the received data is successful (S430); when the error correction operation on the received data is successful (S430: Yes), determining whether the read command that is transmitted to the semiconductor memory device is the first type of read command (S450); when the read command that is transmitted to the semiconductor memory device is the second type of read command other than the first type of read command (S450: No), transmitting the discharge command $CMD_{DSC}$ to the semiconductor memory device (S460).

In step S410, the controller 200 may transmit the read command to the semiconductor memory device 100. When the read command that is transmitted in step S410 is the first type of read command, the semiconductor memory device 100 may perform the read operation that includes the word line discharge step. Meanwhile, when the read command that is transmitted in step S410 is the second type of read command, the semiconductor memory device 100 may perform the read operation without the word line discharge step.

In step S420, the controller may receive the data read from the semiconductor memory device and may perform the error correction operation on the received data. Thereafter, whether the error correction operation on the received data is successful may be determined in step S430. When the error correction operation fails (S430: No), the operation may return to step S410 to control the semiconductor memory device to perform the read operation again. In step S410, the controller may transmit the first type of read command to the semiconductor memory device and may also transmit the second type of read command to the semiconductor memory device as needed. Steps S410, S420, and S430 may be repeated until the error correction operation on the received data is successful. Alternatively, steps S410, S420, and S430 may be repeated only a predetermined number of times.

When the error correction operation on the received data is successful (S430: Yes), the controller may determine whether the read command that is transmitted to the semiconductor memory device 100 immediately before is the first type of read command. When the read command that is transmitted to the semiconductor memory device is the first type of read command (S450: Yes), the semiconductor memory device may perform the read operation that includes the word line discharge step. Therefore, the controller might not separately transmit the discharge command $CMD_{DSC}$ to the semiconductor memory device and may end the operation.

When the read command that is transmitted to the semiconductor memory device is the second type of read command (S450: No), the semiconductor memory device may perform the read operation without the word line discharge step. In this case, the word lines of the semiconductor memory device may maintain the read pass voltage. Therefore, the controller may transmit the discharge command $CMD_{DSC}$ to the semiconductor memory device (S460). As step S460 is performed, the semiconductor memory device 100 may apply the turn-off voltage to the word lines to perform the word line discharge operation.

Figure 19:
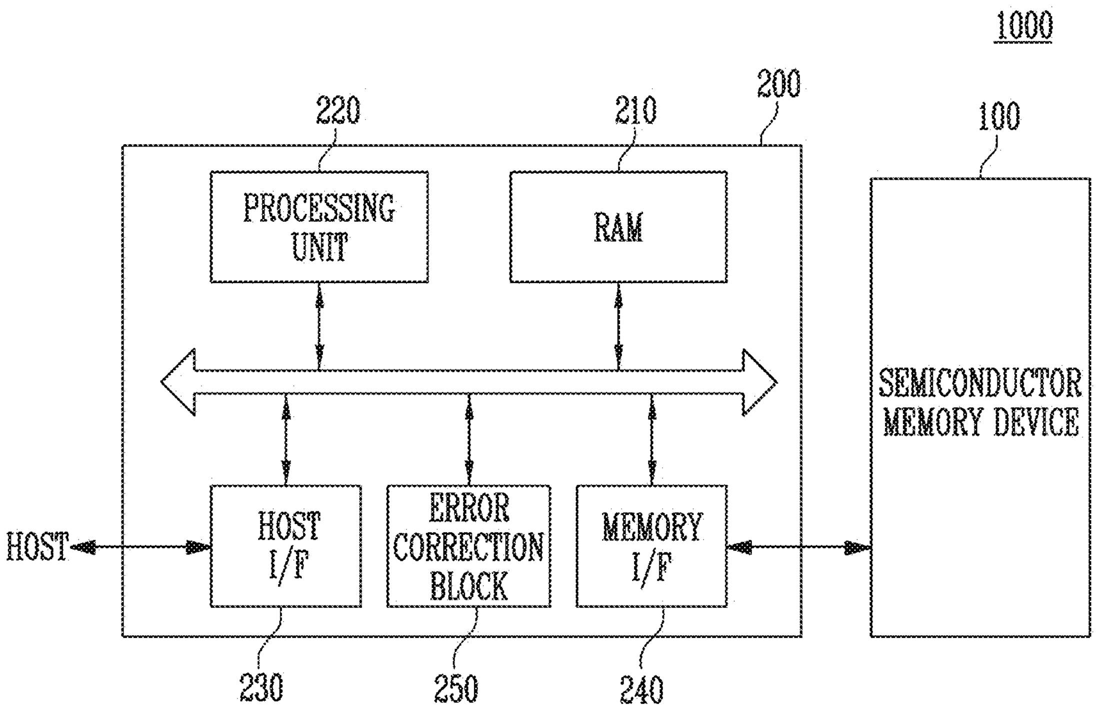
FIG. 19 is a block diagram illustrating an embodiment of a memory system including the semiconductor memory device and the controller.

FIG. 19 is a block diagram illustrating an embodiment of a memory system 1000 including the semiconductor memory device 100 and the controller 200.

Referring to FIG. 19, the memory system 1000 may include the semiconductor memory device 100 and a controller 200. The semiconductor memory device 100 may be the semiconductor memory device that is described with reference to FIG. 2.

The controller 200 may be connected to a host and the semiconductor memory device 100. In FIG. 19, the host may be the host device 300 shown in FIG. 1. The controller 200 may be configured to access the semiconductor memory device 100 in response to a request from the host. For example, the controller 200 may be configured to control read, write, erase, and background operations of the semiconductor memory device 100. The controller 200 may be configured to provide an interface between the semiconductor memory device 100 and the host Host. The controller 200 may be configured to drive firmware for controlling the semiconductor memory device 100.

The controller 200 may include a random access memory (RAM) 210, a processing unit 220, a host interface 230, a memory interface 240, and an error correction block 250. The RAM 210 may be used as at least one of an operation memory of the processing unit 220, a cache memory between the semiconductor memory device 100 and the host Host, and a buffer memory between the semiconductor memory device 100 and the host Host. The processing unit 220 may control an overall operation of the controller 200. In addition, the controller 200 may temporarily store program data that is provided from the host Host during the write operation.

The host interface 230 may include a protocol for performing data exchange between the host Host and the controller 200. In an exemplary embodiment, the controller 200 may be configured to communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 may interface with the semiconductor memory device 100. For example, the memory interface 240 may include a NAND interface or a NOR interface.

The error correction block 250 may be configured to detect and correct an error of data that is received from the semiconductor memory device 100 by using an error correcting code (ECC). The processing unit 220 may control the semiconductor memory device 100 to adjust the read voltage according to an error detection result of the error correction block 250 and perform re-reading. In an exemplary embodiment, the error correction block may be provided as a component of the controller 200.

The controller 200 and the semiconductor memory device 100 may be integrated into one semiconductor device. In an exemplary embodiment, the controller 200 and the semiconductor memory device 100 may be integrated into one semiconductor device to form a memory card. For example, the controller 200 and the semiconductor memory device 100 may be integrated into one semiconductor device to form a memory card, such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) may include a storage device configured to store data in a semiconductor memory. When the memory system 1000 is used as the semiconductor drive (SSD), an operation speed of the host that is connected to the memory system 1000 may be dramatically improved.

In another example, the memory system 1000 may be provided as one of various components of an electronic device, such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an exemplary embodiment, the semiconductor memory device 100 or the memory system 1000 may be mounted as a package of various types. For example, the semiconductor memory device 100 or the memory system 1000 may be packaged and mounted in a method, such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 20:
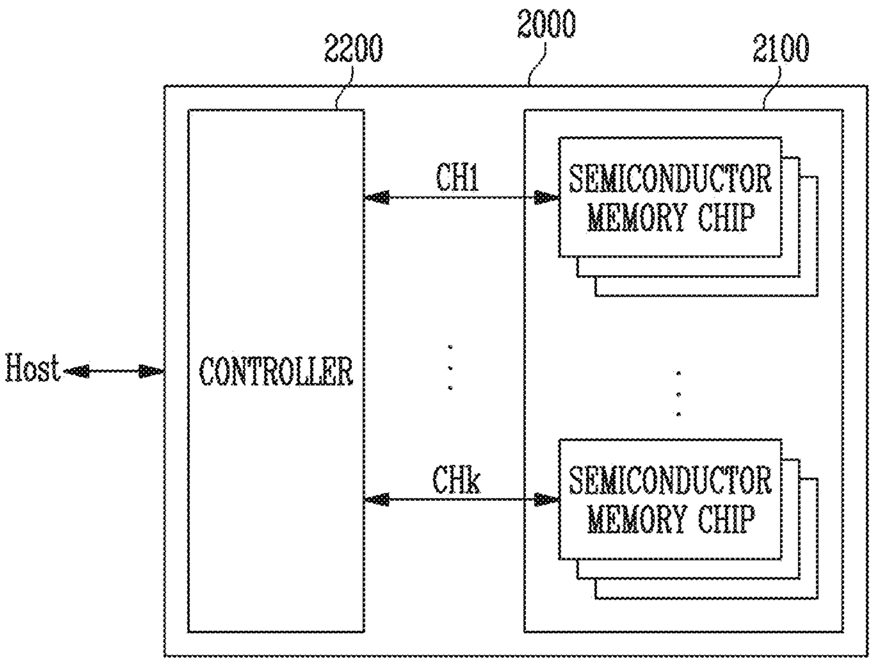
FIG. 20 is a block diagram illustrating an application example of the memory system of FIG. 19.

FIG. 20 is a block diagram illustrating an application example of the memory system of FIG. 19.

Referring to FIG. 20, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 20, the plurality of groups may communicate with the controller 2200 through first to k-th channels CH1 to CHk, respectively. Each semiconductor memory chip may be configured and may be operated similarly to the semiconductor memory devices 100, described with reference to FIG. 2.

Each group may be configured to communicate with the controller 2200 through one common channel. The controller 2200 may be configured similarly to the controller 200 described with reference to FIG. 19 and may be configured to control the plurality of memory chips of the semiconductor memory device 2100 through the plurality of channels CH1 to CHk.

Figure 21:
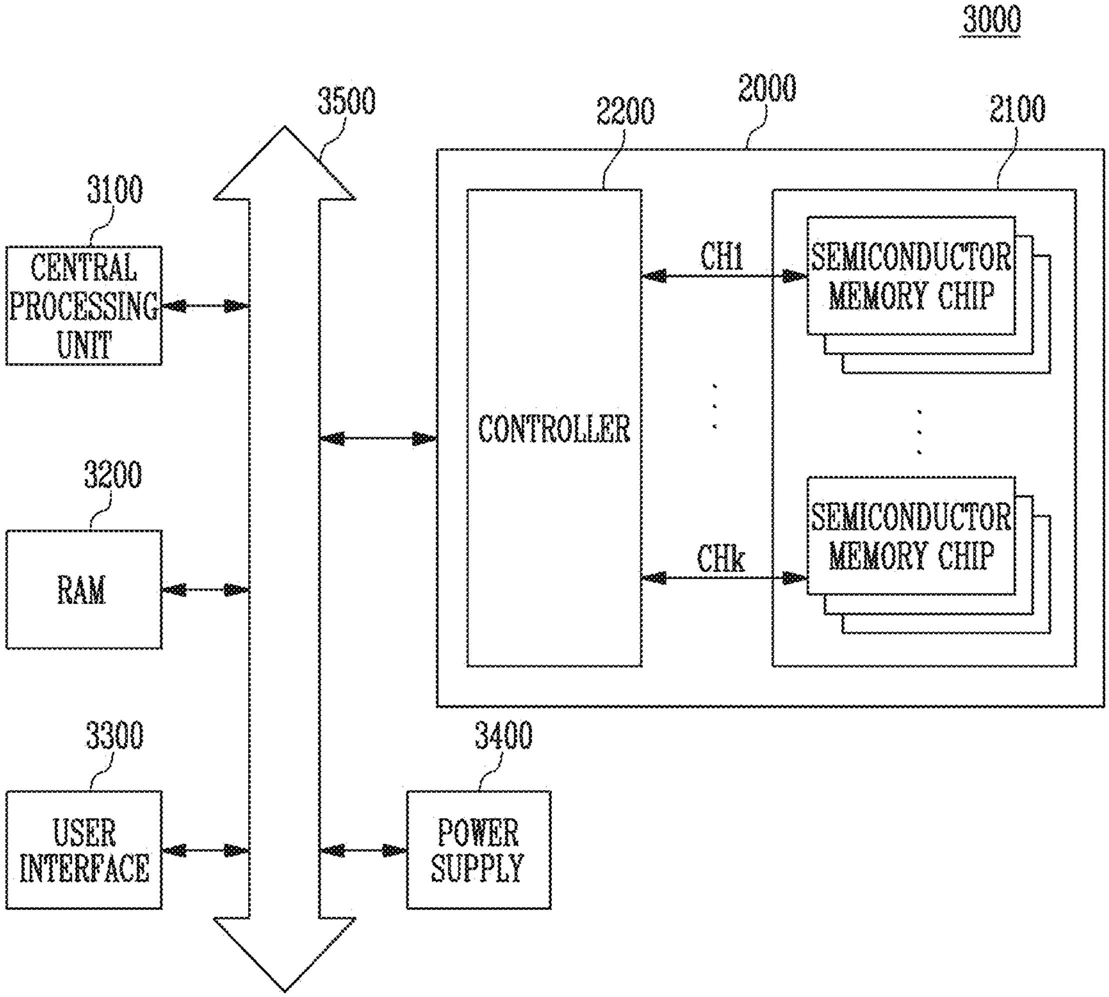
FIG. 21 is a block diagram illustrating a computing system including the memory system described with reference to FIG. 20.

FIG. 21 is a block diagram illustrating a computing system including the memory system, described with reference to FIG. 20.

The computing system 3000 includes a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data that is provided through the user interface 3300 or processed by the central processing unit 3100 is stored in the memory system 2000.

In FIG. 21, the semiconductor memory device 2100 may be connected to the system bus 3500 through the controller 2200. However, the semiconductor memory device 2100 may be configured to be directly connected to the system bus 3500. At this time, a function of the controller 2200 may be performed by the central processing unit 3100 and the RAM 3200.

In FIG. 21, the memory system 2000, described with reference to FIG. 20, is provided. However, the memory system 2000 may be replaced with the memory system 1000 described with reference to FIG. 19. In an exemplary embodiment, the computing system 3000 may be configured to include both of the memory systems 1000 and 2000, described with reference to FIGS. 19 and 20.

What is claimed is:

1. A method of operating a controller for controlling a read operation of a semiconductor memory device including a plurality of memory cells, the method comprising:
- transmitting a first type of read command to the semiconductor memory device;
- receiving first data from the semiconductor memory device; and
- determining whether to transmit a second type of read command to the semiconductor memory device based on whether an error correction operation on the first data is successful,
- wherein the first type of read command controls the semiconductor memory device to perform a read operation including a word line discharge operation, and
- wherein the second type of read command controls the semiconductor memory device to perform a read operation without the word line discharge operation.

2. The method of claim 1, wherein determining whether to transmit the second type of read command to the semiconductor memory device based on whether the error correction operation on the first data is successful comprises:
- transmitting the second type of read command to the semiconductor memory device when the error correction operation on the first data fails; and
- receiving second data from the semiconductor memory device.

3. The method of claim 2, further comprising:
- transmitting a second type of read command to the semiconductor memory device when an error correction operation on the second data fails.

4. The method of claim 2, further comprising:
- transmitting, to the semiconductor memory device, a discharge command for controlling the semiconductor memory device to perform the word line discharge operation when the error correction operation on the second data is successful.

5. The method of claim 1, wherein the first and second type of read commands control the semiconductor memory device to:
- perform a channel precharge operation by applying a first voltage to a plurality of word lines in response to one of the first and second read commands;
- perform a threshold voltage sensing operation by applying at least one read voltage to a selected word line, among the plurality of word lines, connected to selected memory cells; and
- perform a word line equalize operation by applying a second voltage to the plurality of word lines.

6. The method of claim 5, wherein the first type of read command controls the semiconductor memory device to perform, after the word line equalize operation, a word line discharge operation by applying a third voltage having a lower voltage than the second voltage to the plurality of word lines.

7. The method of claim 5, wherein the second type of read command controls the semiconductor memory device to maintain a voltage of the plurality of word lines after the word line equalize operation.

8. The method of claim 4, wherein the discharge command controls the semiconductor memory device to decrease a voltage of a plurality of word lines after the word line equalize operation.

* * * * *